(12) United States Patent
Emami

(10) Patent No.: US 9,171,746 B2
(45) Date of Patent: Oct. 27, 2015

(54) HEATER ELEMENTS WITH ENHANCED COOLING

(76) Inventor: Arsalan Emami, Aliso Viejo, CA (US)

( * ) Notice: Subject to any disclaimer, the term of this patent is extended or adjusted under 35 U.S.C. 154(b) by 537 days.

(21) Appl. No.: 13/602,322

(22) Filed: Sep. 4, 2012

(65) Prior Publication Data

US 2013/0062333 A1    Mar. 14, 2013

Related U.S. Application Data

(60) Provisional application No. 61/573,450, filed on Sep. 6, 2011.

(51) Int. Cl.
| | |
|---|---|
| *H01L 21/67* | (2006.01) |
| *H01L 23/467* | (2006.01) |
| *F27D 1/00* | (2006.01) |
| *F27B 5/08* | (2006.01) |
| *F27D 9/00* | (2006.01) |

(52) U.S. Cl.
CPC ............ *H01L 21/67109* (2013.01); *F27B 5/08* (2013.01); *F27D 1/0006* (2013.01); *H01L 21/67098* (2013.01); *H01L 23/467* (2013.01); *F27D 2009/0005* (2013.01)

(58) Field of Classification Search
None
See application file for complete search history.

(56) References Cited

U.S. PATENT DOCUMENTS

| | | | | |
|---|---|---|---|---|
| 6,756,565 | B2 * | 6/2004 | Suenaga et al. | 219/390 |
| 6,949,719 | B2 * | 9/2005 | Suenaga et al. | 219/390 |
| 2002/0088610 | A1 * | 7/2002 | Suenaga et al. | 165/135 |
| 2004/0195230 | A1 * | 10/2004 | Suenaga et al. | 219/390 |
| 2006/0083495 | A1 * | 4/2006 | Taiquing | 392/416 |
| 2008/0296282 | A1 * | 12/2008 | Kobayashi et al. | 219/385 |
| 2009/0095422 | A1 * | 4/2009 | Sugishita et al. | 156/345.27 |
| 2010/0224614 | A1 * | 9/2010 | Kobayashi et al. | 219/385 |
| 2013/0058372 | A1 * | 3/2013 | Emami | 373/117 |
| 2015/0093909 | A1 * | 4/2015 | Murata et al. | 438/758 |

FOREIGN PATENT DOCUMENTS

| | | | | |
|---|---|---|---|---|
| JP | 04369215 | A | * 12/1992 | H01L 21/22 |
| JP | 3 108134 | | 11/2000 | |
| WO | WO 2007/097199 | | 8/2007 | |

OTHER PUBLICATIONS

PCT preliminary report on patentability—PCT/IB2012/054572—dated Mar. 12, 2014.

* cited by examiner

*Primary Examiner* — Joseph M Pelham

(57) ABSTRACT

A heater assembly with enhanced cooling pursuant to various embodiments described herein makes use of fluidic flow in the insulation or in the space used for insulation. By creating a natural convection or forced convection flow, the heater cools down faster, it can operate at lower temperatures and/or higher temperature precision, and it can improve temperature controllability by generating higher heat loss rates.

15 Claims, 22 Drawing Sheets

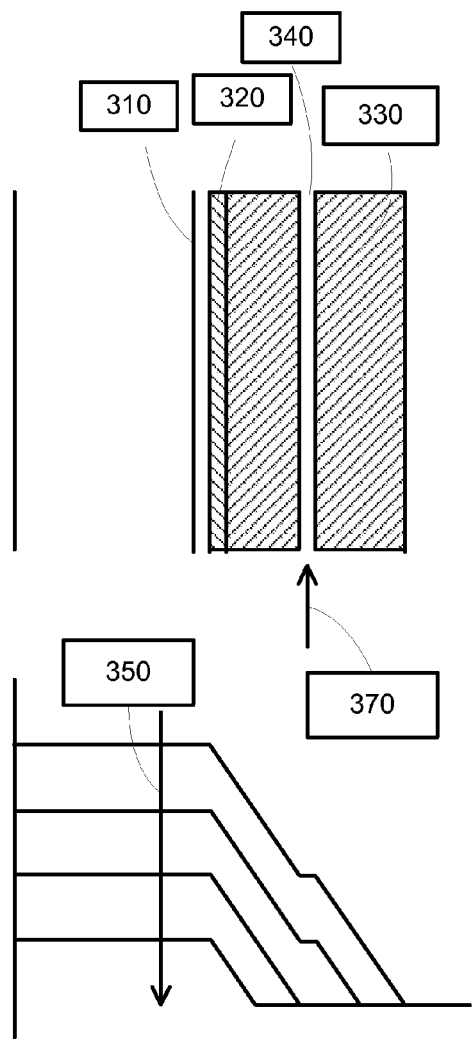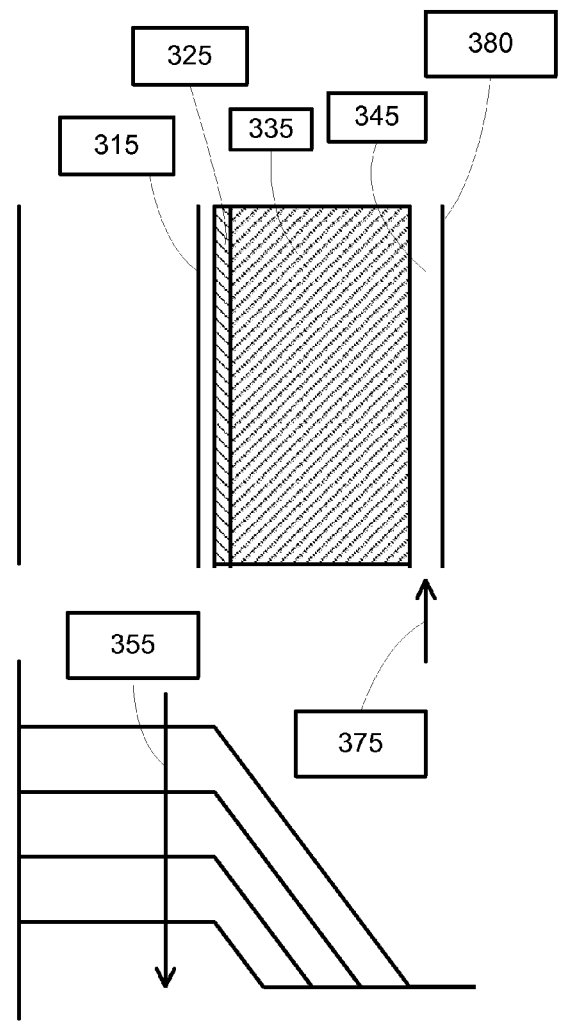
Fig. 3A
Fig. 3B

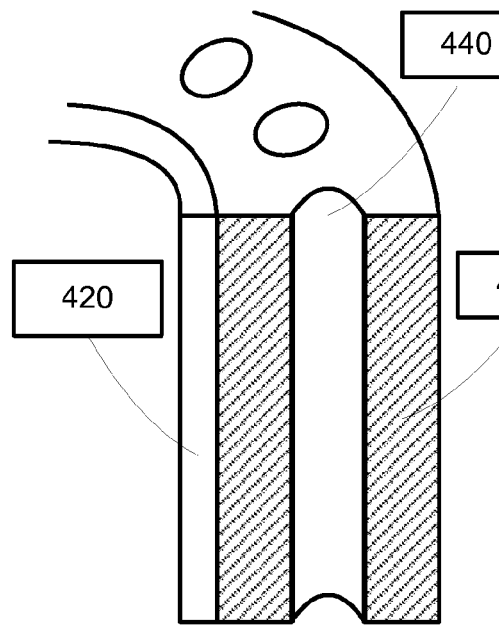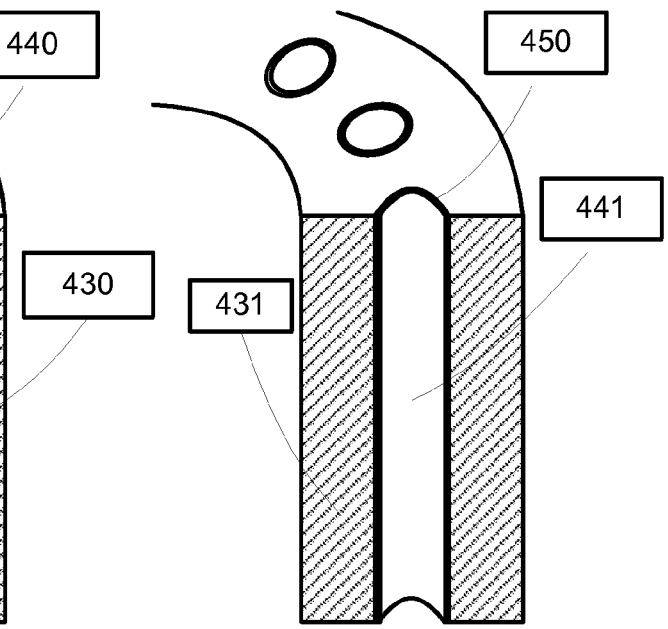
Fig. 4A  Fig. 4B
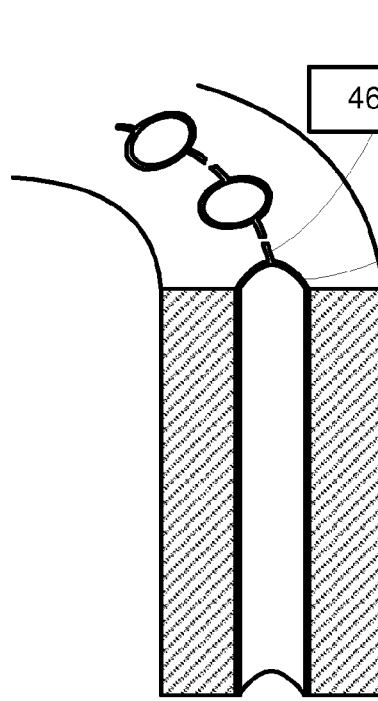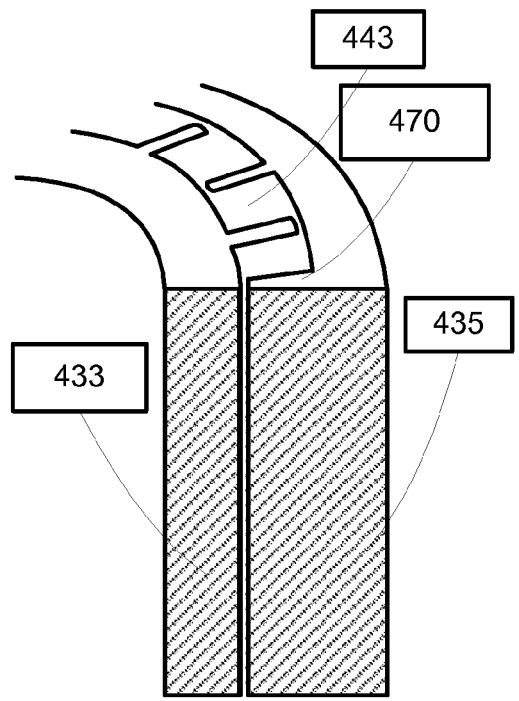
Fig. 4C  Fig. 4D

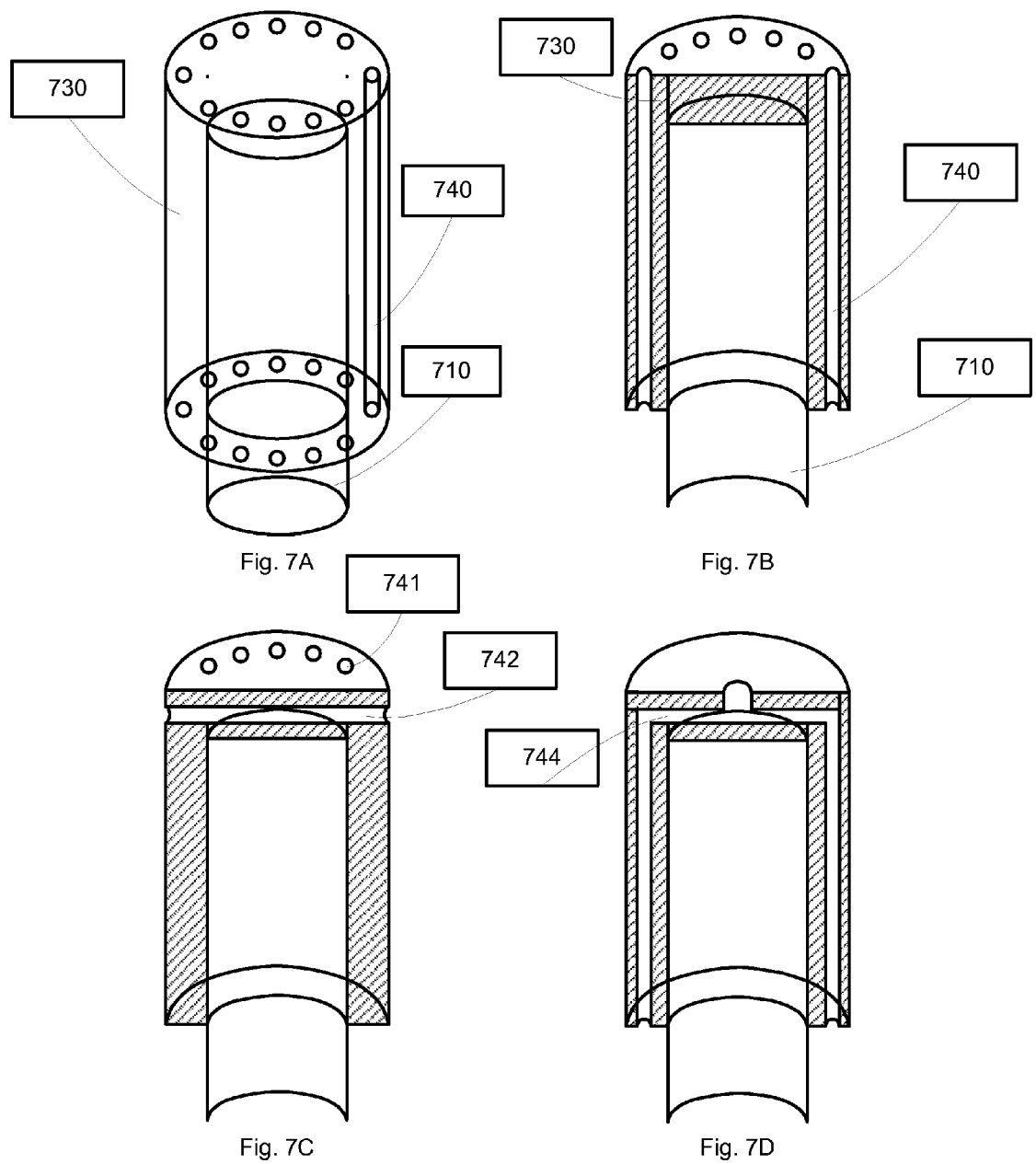

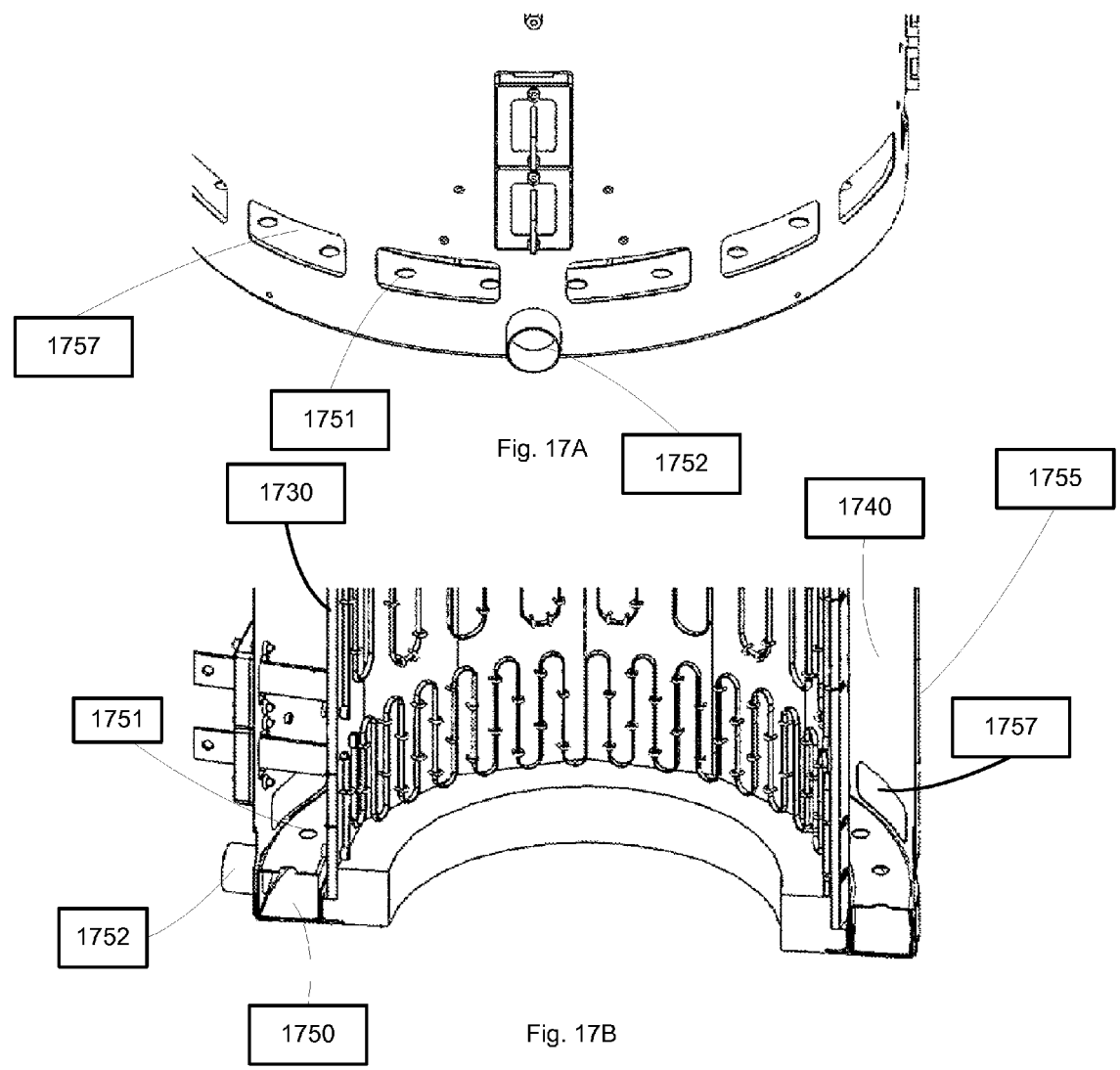

```
┌─────────────────────────────────────────┐
│ Providing a heated chamber, wherein at least a portion │
│ of the heated chamber is covered with an insulator     │
│ layer to insulates the chamber          │
│ 2100                                    │
└─────────────────────────────────────────┘
                    │
                    ▼
┌─────────────────────────────────────────┐
│ Flowing a fluidic flow through a plurality of channels of │
│ the insulator layer                     │
│ 2110                                    │
└─────────────────────────────────────────┘
```

Fig. 21A

```
┌─────────────────────────────────────────┐
│ Providing a heated chamber, wherein at least a portion │
│ of the heated chamber is covered with an insulator     │
│ layer to insulates the chamber          │
│ 2150                                    │
└─────────────────────────────────────────┘
                    │
                    ▼
┌─────────────────────────────────────────┐
│ Adjusting a fluidic flow through a plurality of channels │
│ of the insulator layer                  │
│ 2160                                    │
└─────────────────────────────────────────┘
```

Fig. 21B

HEATER ELEMENTS WITH ENHANCED COOLING

The present application claims priority from provisional application Ser. No. 61/573,450, filing date Sep. 6, 2011, entitled "Heater elements with enhanced cooling", all of which is hereby incorporated by reference in their entirety.

BACKGROUND

Many process steps in the manufacturing of semiconductor devices are performed in a furnace. A furnace system can include a wafer loading assembly for transferring wafers to and from the furnace. Process gases can be introduced to the furnace for processing. A furnace can include a quartz tube, forming the furnace processing chamber. Heating elements can be provided on the outside the quartz tube. Heating insulation can be used to cover the heating elements, insulating the high temperature furnace processing chamber from the room temperature outside ambient. The heating insulation can minimize heat loss, resulting in higher heating temperature and faster ramp up rate for the furnace. However, the heating insulation can affect the ramp down rate of the furnace chamber, resulting in lower processing throughput.

SUMMARY OF THE DESCRIPTION

In some embodiments, the present invention discloses a heater assembly, and a furnace utilizing the heater assembly, that can have enhanced cooling. The enhanced cooling features can allow improved cooling rates for the heater assembly, without and with minimum effect on the uniform temperature profile within the furnace. The enhanced cooling features can include one or more channels, either embedded within an insulation layer of the heater assembly, or between an outer surface of the insulation layer and a protected shell of the heater assembly. The enhanced cooling can include fluidic flow, such as gaseous flow or liquid flow. Adjustment features for the flow conductance can be added, for example, to change the entrance or exit openings of the channels. A pump, a blower or a fan can be included for control the flow rates through the channels. A controller can also be included for automatic regulating the fluidic flow.

In some embodiments, the present invention discloses a method to control, adjust or regulate a heater assembly, or a furnace utilizing the heater assembly, wherein the heater assembly can have enhanced cooling. By controlling a fluidic flow through the channels of the insulation layer of the heater assembly, faster ramp rates or higher temperature precision for a furnace can be achieved.

BRIEF DESCRIPTION OF DRAWINGS

FIGS. 3A-3B illustrate heater configurations according to some embodiments of the present invention.

FIGS. 4A-4D illustrate configurations of an insulation layer according to some embodiments of the present invention.

FIGS. 7A-7D illustrate other configurations of heater furnaces according to some embodiments of the present invention.

FIGS. 17A-17B illustrate a bottom section of a heater assembly according to some embodiments of the present invention.

FIGS. 21A-21B illustrate flowcharts for controlling a heater assembly, and a furnace utilizing a heater assembly, according to some embodiments of the present invention.

DETAILED DESCRIPTION OF THE PREFERRED EMBODIMENTS

Process cycle time and system throughput can be critical parameters in the design and evaluation of most semiconductor fabrication processes. Heating and cooling are important contributors to the overall cycle time such that more rapid heating and/or cooling have the potential to reduce cycle times, perhaps markedly.

In some embodiments, the present invention discloses heater elements having enhanced cooling properties, which can be suitable for use in furnaces, such as semiconductor processing furnaces. These heater elements can improve system temperature control and, by providing a faster cool down rate, can reduce cycle time substantially.

Figure 1A:
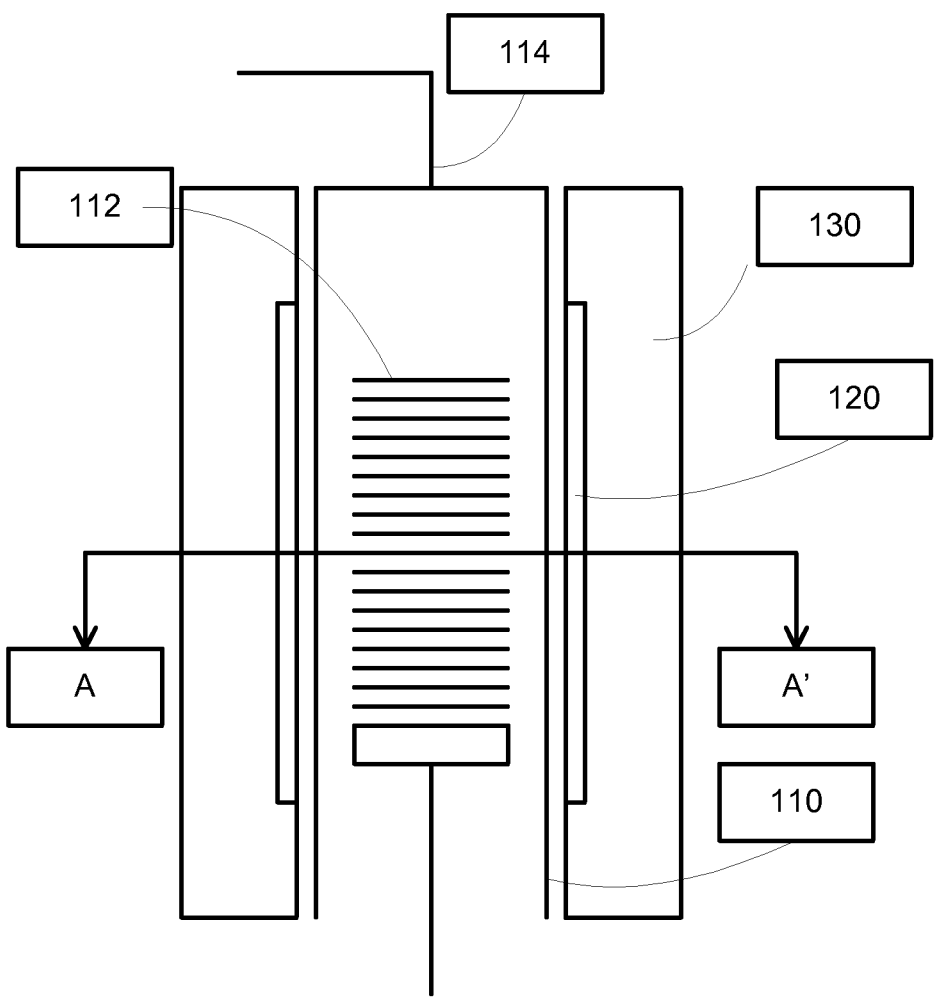
FIGS. 1A-1B illustrate a furnace and its temperature profile according to some embodiments of the present invention.
Figure 1B:
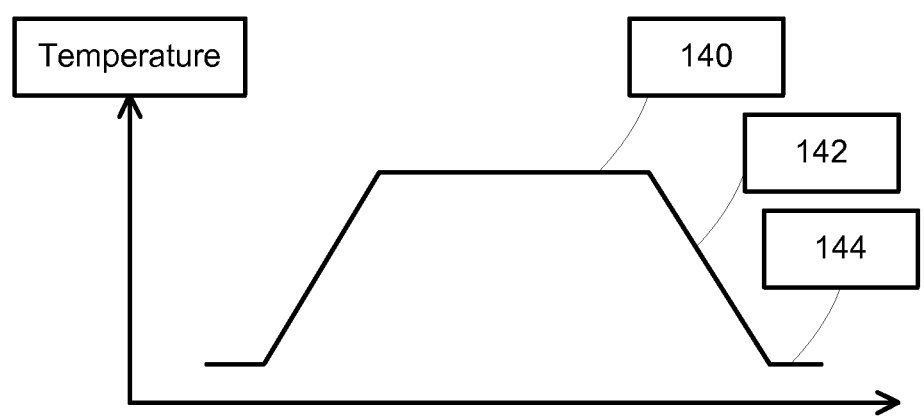

FIGS. 1A-1B illustrate a furnace and its temperature profile according to some embodiments of the present invention. In FIG. 1A, a chamber 110 can be heated, for example, by heater elements 120 to a process temperature 140. Wafers 112 can be placed in the chamber 110, which can be supplied with process gas 114. Insulation layer 130 can be used to cover the heater elements 120, insulating the heated chamber from the outside ambient. The insulation layer can limit the heat loss from the heated chamber 110, providing a temperature gradient 142 between the process temperature 140 within the chamber 110 and the temperature 144 of the outside ambient. FIG. 1B shows a schematic of the temperature profile across section A-A' or the furnace, showing a substantially uniform temperature 140 in the chamber region, and a gradual drop 142 in temperature to reach the outside temperature 144. The temperature profile is shown as an indication of the temperature variation, in which many details can be omitted, such as minor variations in the uniform profile 140 within the chamber, the gradual transition between the uniform profile 140 and the slope profile 142, and the non-linear slope profile 142 within the insulation layer 130.

Figures 2A, 2B:
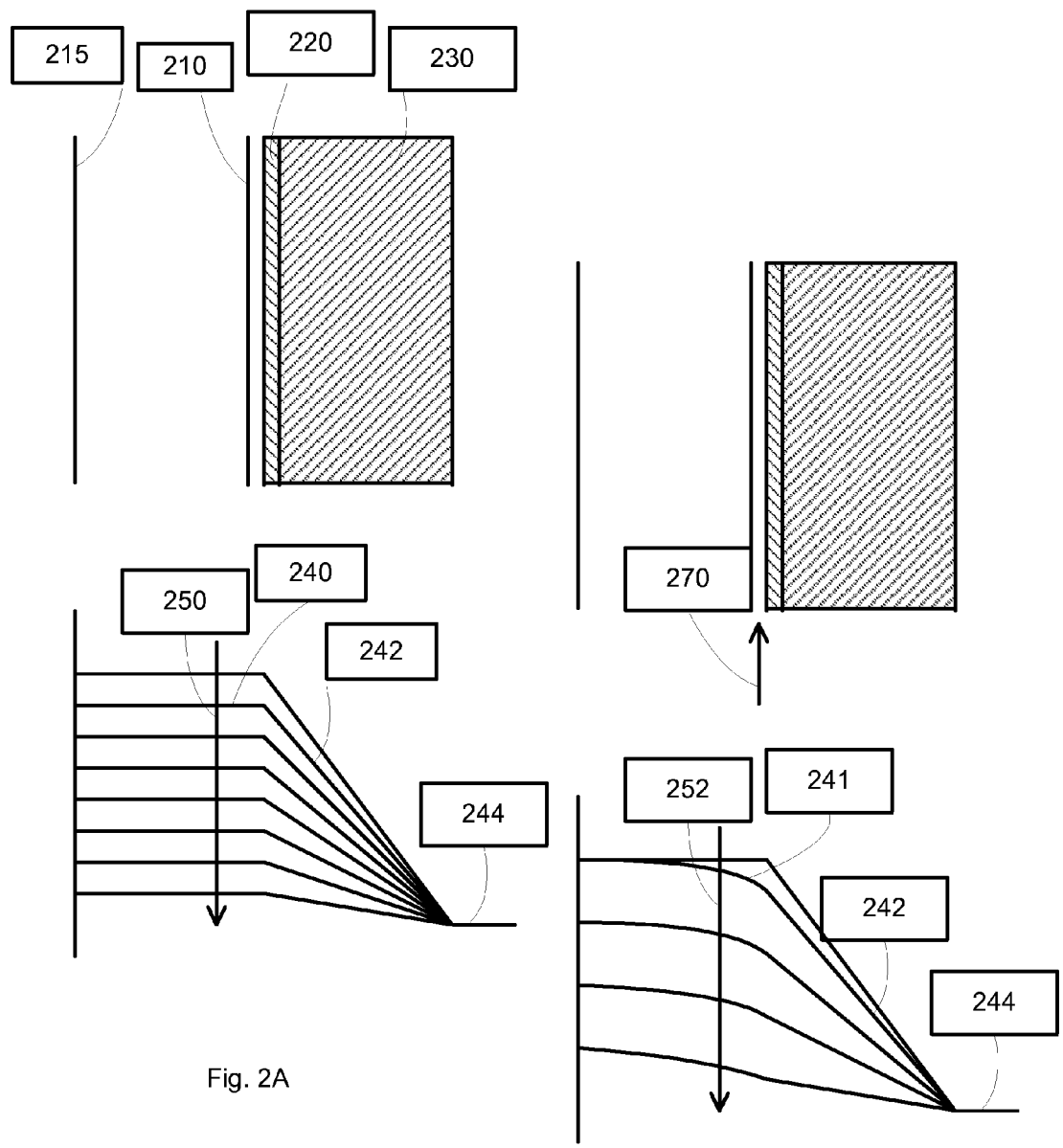
FIGS. 2A-2B illustrate two basic types of heaters in common use.

FIGS. 2A-2B illustrate two basic types of heaters in common use. FIG. 2A shows a furnace having heater 220 with insulation 230, which surrounds a process chamber 210. One side of the furnace is shown, separated a center line 215. This furnace can be used for several applications and temperature ranges. The temperature profile 240 can be uniform within the chamber 210, and gradually drop 242 to ambient temperature 244. The temperature can be ramped up at rates up to about 20 C per minute, and ramped down rate 250 ("cool down") in the range of about 2-5 C per minute.

FIG. 2B shows a furnace using "fast-ramp" heaters, also referred to herein as "forced air" heaters. These heaters provide faster ramp up and cool down rates than those achievable with the standard heater. The higher cool down rates 252 can be achieved by forcing airflow 270 inside the heater, between the quartz tube 210 inserted inside the center cavity of the heater element and the heater element 220. This forced air flow removes heat from the heater and the wafers placed inside the quartz tube by forced convection. While this forced air method achieves faster cool down rates of up to about 20 C per minute, it is very complex and expensive. At times the wafer load cannot be cooled as quickly as the full cool down capability of the heater due to slip in the wafer structure caused by unacceptable temperature gradients 241 between the edge and the center of the wafer.

In some embodiments, the present invention discloses methods and systems for improving temperature control of a furnace. For example, a heater system is provided with improved ramp up and cool down rates as compared to conventional heaters, together with lower complexity and expense of typical forced air heaters and without the necessity of expensive modifications to a typical existing furnace.

In some embodiments, the present invention introduces cooling capabilities into the region of the heater that is typically used for insulation. Heat is removed from the heater by fluidic flow, such as air or water flow through natural convection or air blower, within the heater insulation or against the heater insulation, for example, depending on the heater's operating temperature range. For example, the heater can be equipped with an air plenum at the bottom of the cavity channels within the insulation or between the insulation and the heater's external shell. When higher cool down rates are desired, air can be forced through the plenum by use of a blower located outside of the heater assembly. The forced air removes the heat from the outer boundary of the heater insulation, enhancing the cool down rate of the substrates inside the heater.

FIGS. 3A-3B illustrate heater configurations according to some embodiments of the present invention. FIG. 3A shows a heater system including an insulation layer 330 surrounding a heater element 320, which insulates the heat within a heated process chamber 310 from escaping. Multiple channels 340 can be provided within the insulation layer 330, which can be used to control the temperature in the process chamber, for example, to increase the cool down rate of the heated chamber with minimum effect on the temperature profile of the heated chamber. For example, by introducing a flow 370 to the multiple channels 340, the cool down rate 350 can be higher since the flow 370 can lower the temperature of the insulation layer, effectively increasing the heat transfer rate of the chamber temperature profile. Since the flow 370 affects the temperature outside of the heated chamber, the heat loss rate of the heated chamber can be uniform, e.g., the heat loss rate at the center of the heated chamber can be similar to the heat loss rate at the edge of the heated chamber, resulting in maintaining a substantially uniform temperature profile as the temperature decreasing. Alternatively, the flow 370 can also affect the heating rate of the heater element 320, for example, by providing a heated flow 370.

FIG. 3B shows another heater system including an insulation layer 335 surrounding a heater element 325, which insulates the heat within a heated process chamber 315 from escaping. A surrounding gap 345 can be disposed between the insulation layer 335 and an outer shell 380, which can insulate the insulation layer 345 from the outside ambient. The surrounding gap 345 can control the boundary temperature of the insulation layer 335, which can change the behavior of the heating rates due to the heater element 325. For example, by providing a heated flow 375 to the gap 345, a faster ramp up rate for the process chamber 315 can be achieved. Alternatively, a room temperature or a cooler flow 375 can increase the cooled down rate 355 of the heated chamber 315. As shown, the temperature profiles due to the multiple channels 370 or the surrounding gap 375 are illustrative, and are not meant to limit the validity of the present invention, which can provide improved temperature controls due to channels 370 within the insulation layer or channels 375 at the outer surfaces of the insulation.

FIGS. 4A-4D illustrate configurations of an insulation layer according to some embodiments of the present invention. In FIG. 4A, an insulation layer 430 can have multiple channels 440 disposed within the thickness of the insulation layer 430. The channels can be distributed at a substantially similar distance from a heater element 420. As shown, the insulation layer 430 has a curve shape, but other shapes can be used, such as a flat plate of insulation layer. Further, the channels can have any cross section shape, such as circle, oval, rectangular, or square. The channels can be distributed substantially uniform surrounding the heater element 420. In some embodiments, the distance between the channels 440 and the heater element 420 can be selected to optimize a cooling rate, e.g., smaller distance, and a uniform temperature profile within the heated chamber during the cool down process, e.g., larger distance. As shown, the channels include straight channels running along the width of the insulation layer 430. Other configurations for the channels can also be used, such as curved channels, non-uniform cross section channels, e.g., larger cross section at the bottom and smaller cross section at the top or vice versa.

In some embodiments, the channels 440 are embedded inside the insulation layer to provide improved cooling capability. The channels can be fabricated by a vacuum formation process, for example, by solidifying an insulation material having embedded channels through vacuum suction. The channels, such as tube-shaped cavities, can also be machined into the insulation layer. The insulation can be used to attain higher temperatures for the heated chamber, while the channels can allow fluidic flow, either by natural convection of by forced gas or liquid flow, to increase the heat removal rate through the insulation, which can cause the heated chamber to cool down faster. For example, a bottom flange can be included to direct high air flow into these channels once air flow is activated.

In some embodiments, the insulation layer with embedded channels can be vacuum-formed, which can be an advantageous fabrication technology. However, embodiments of the present invention are not limited to this fabrication technology. For example, tubing can be embedded in the insulation, typically copper tubing, ceramic tubing or numerous other types of tubing as obvious to those with ordinary skill in the art. Fins can also be incorporated to the channels for heat dissipation.

In FIG. 4B, the channels 441 embedded in the insulation layer 431 can include tubes 450. Hollow tubes 450 can be inserted to the insulation layer 431 to form the channels 441. In FIG. 4C, tubes 452 can include fins 460, which can improve the heat dissipation process, for example, by forming a boundary having low temperature surrounding the heater element. In FIG. 4D, a channel 443 can be disposed surrounding the heater element, separating the insulation layer into an inner layer 433 and an outer layer 435. Fins 470 can be included, e.g., for improved heat conduction or for separating the channel 443. Other configurations can also be used, such as a surrounding channel without fins, or surrounding channels covered by a layer of conduction material such as a metal.

In some embodiments, the insulation layer having embedded channels can be used for heated chambers in temperature range from about 25 C to about 2000 C, from about 200 C to about 1300 C, or from about 500 C to about 1100 C operating range, for example, in the semiconductor industry. This temperature range sometimes can be call "Mid-Temp" operating range.

Figures 5A, 5B:
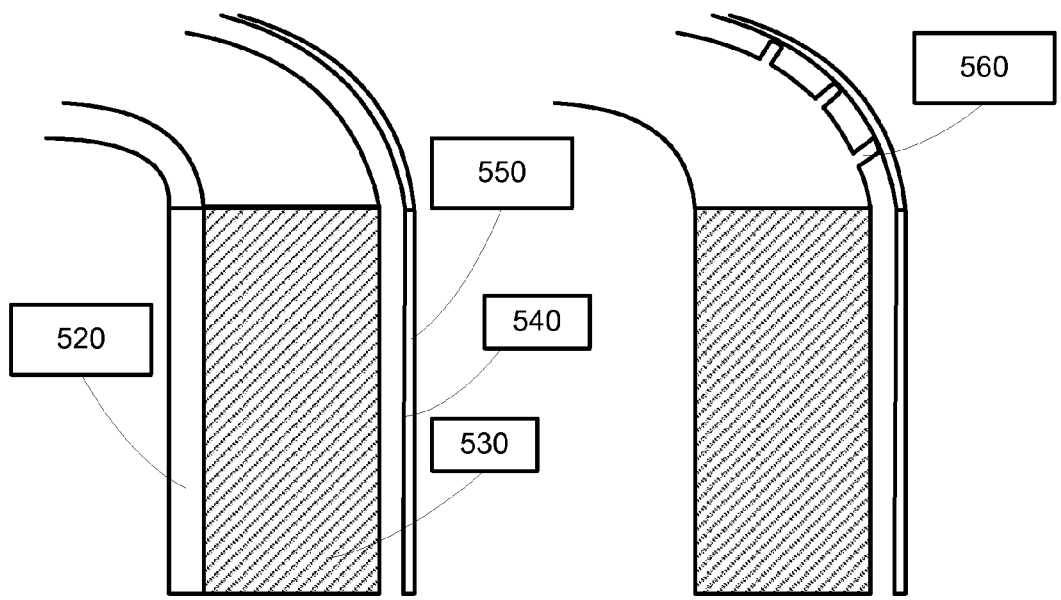
FIGS. 5A-5D illustrate other configurations of an insulation layer according to some embodiments of the present invention.

FIGS. 5A-5D illustrate other configurations of an insulation layer according to some embodiments of the present invention. In FIG. 5A, an insulation layer 530 can surround a heater element 520 for insulating the thermal energy. At the outer side of the insulation layer 530, one or more channels 540 can be established, for example, between the insulation layer 530 and an outer shell 550. The outer channel 540 can include a channel surrounding the insulation layer, or can include multiple channels distributed surrounding the insulation layer. In FIG. 5B, additional fins 560 can be provided, for example, to separate the channel 540 or to improve the heat dissipation at the outer surface of the insulation layer 530.

Figures 5C, 5D:
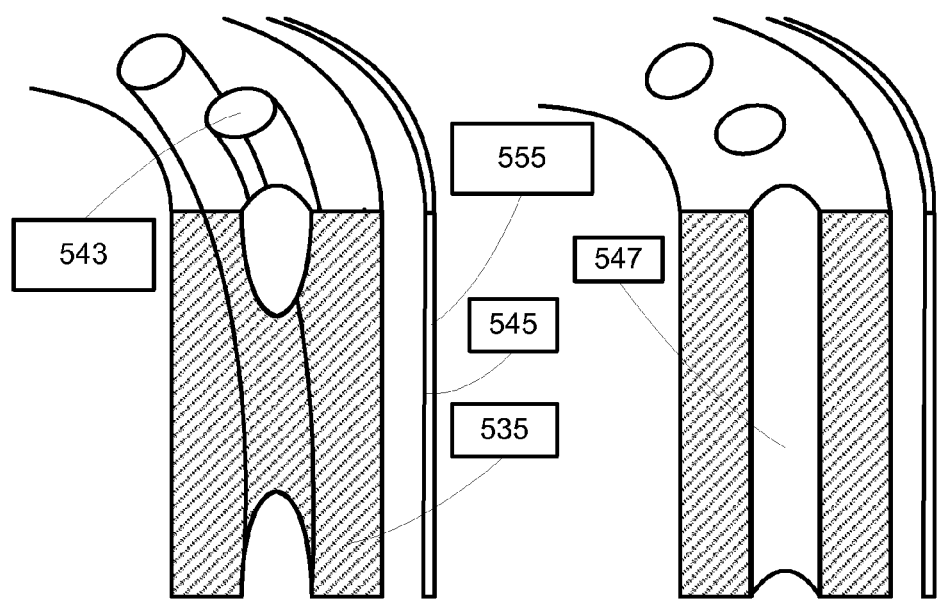

In some embodiments, both embedded channels and outer channels can be used. In FIG. 5C, curved embedded channels 543 can be disposed within the insulation layer 535, together with outer channel 545 positioned between the outer surface of the insulation layer 535 and an outer shell 555. In FIG. 5D, the channels 547 can be straight channels. Other configurations can be used, such as curved embedded channels 543 without the outer channel 545, or embedded channels 547 with multiple outer channels 560 having fins.

In some embodiments, the insulation layer having outer channels can be used for heated chambers in temperature range from about 100 C to about 500 C. This temperature range sometimes can be call "Low-Temp" operating range. In general, lower operating temperatures can use a greater amount of cooling, e.g., gas or liquid flow, to achieve the desired effect on the cool down rate. For example, a fluidic flow can be caused to flow between the heater inner insulation and the heater shell. This area can provide the space necessary to generate airflow by natural convection or forced convection when a fluidic flow is provided.

The heater shell 550 or 555 can be the outer piece of the heater assembly and is typically made of stainless steel, aluminum or other materials having sufficient strength to protect the inner components of the heater. For increased cooling during operation at the lower temperature applications, instead or in addition to forced gas flow, e.g., air flow, liquid flow such as water lines with good thermal conductivity (typically copper) can be used to remove heat more effectively. The copper lines can be embedded in the insulation layer or placed in the space available between the insulation layer and the outer shell.

In some embodiments, the present invention discloses a heater assembly and a heater furnace with improved controls, such as faster heating or cooling rates while still maintaining a uniform temperature profile within the heated chamber. The heater assembly can include a heater element and a heater insulation layer with temperature control channels, either embedded within the insulation layer or at the outer surface of the insulation layer. In addition, the heater assembly can surround a heated chamber with open sides, or can completely cover the heated chamber. The heated chamber can have a cylinder shape, a rectangular shape, or any other shapes.

Figures 6A, 6B:
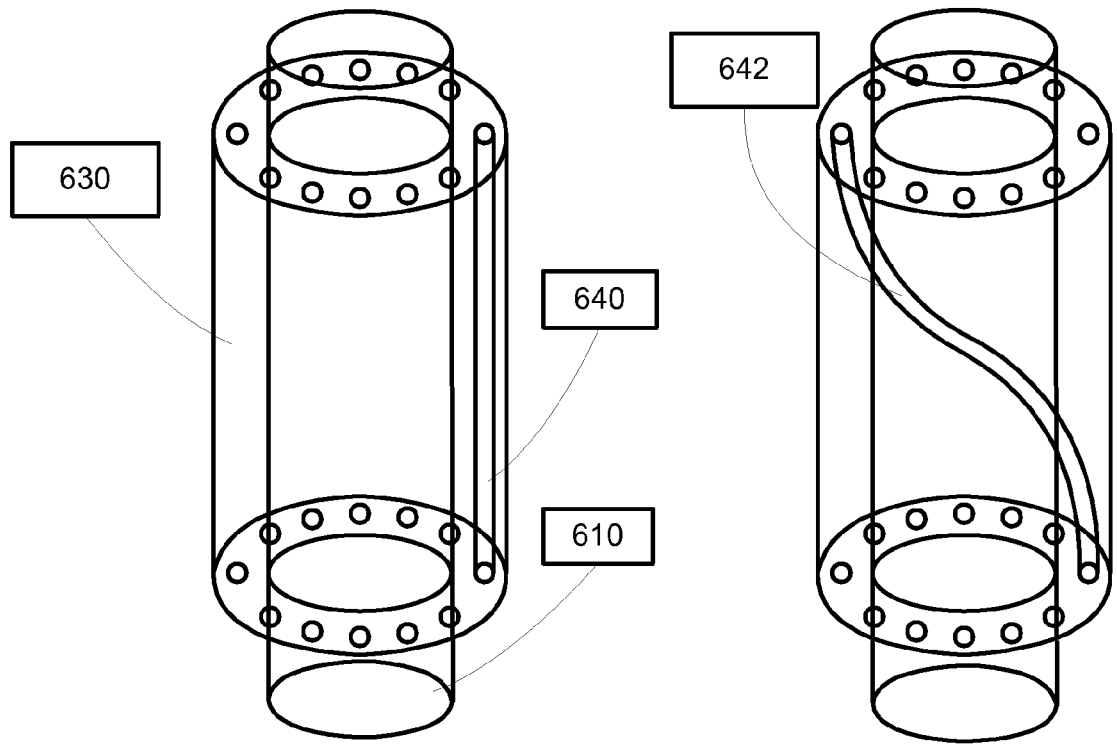
FIGS. 6A-6D illustrate configurations of heater furnaces according to some embodiments of the present invention.

FIGS. 6A-6D illustrate configurations of heater furnaces according to some embodiments of the present invention. In FIG. 6A, a cylindrical shape heater chamber 610 is surrounded by a heater assembly 630 having channels 540 embedded within the insulation layer. The channels can be straight channels 640, or can be curved channels 642 (FIG. 6B). The curved channels can be twisted within the insulation layer.

Figures 6C, 6D:
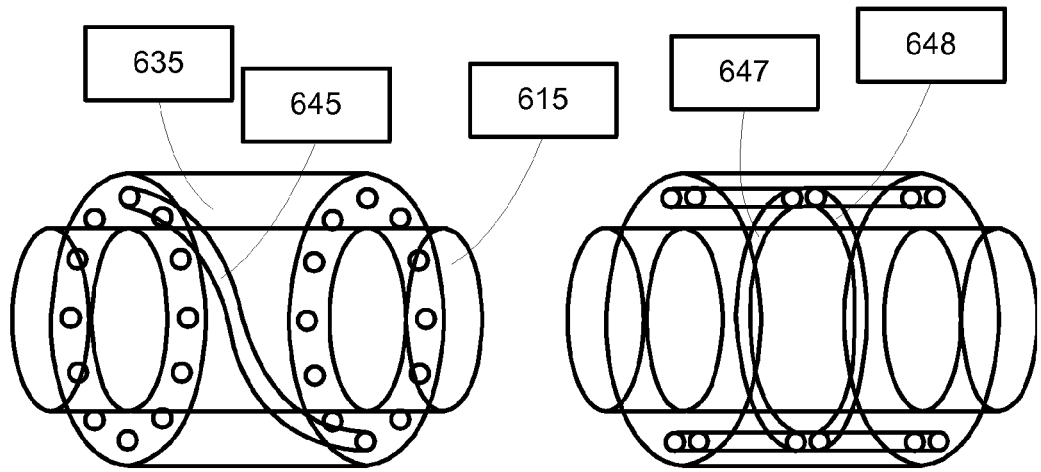

In FIG. 6C, a cylindrical shape heater chamber 615 can be position as a horizontal configuration, with twisted channels 645 running within the insulation layer of the heater assembly 635. In some embodiments, the channels can include vertical direction, e.g., minimizing horizontal portions of the channels to aid in possible natural convection flow of a fluidic flow within the channels. In FIG. 6D, another configuration for the channels is shown, in which the channels 647 and 648 can run vertically along the insulation layer, with openings at both ends for fluid to enter to exit. Other configurations can also be used, such as connecting channels 647 and 648, forming a circular channel with one inlet at the bottom and one outlet at the top.

In some embodiments, vertical furnaces can allow for more stringent specifications, for example, permitting automated loading and unloading of workpieces such as wafers or substrates. This can be important for the modern semiconductor industry. In some embodiments, horizontal furnaces can be used, for example, in the manufacture of solar panels which typically have less stringent process requirements.

In some embodiments, the heater assembly can be placed in a horizontal orientation in the horizontal furnaces, in contrast with vertical heater placement in vertical furnaces. For supplemental fluid flow, either by natural convection or for fluid flow, to enhance cooling, the fluid flow can be designed to be in the direction of rising heat in either vertical or horizontal furnaces. Thus, another flange or plenum can be used on both sides of the heater to provide flows in channels 647 and 648 in a horizontal furnace with enhanced cooling.

FIGS. 7A-7D illustrate other configurations of heater furnaces according to some embodiments of the present invention. In FIGS. 7A and 7B, a cylindrical shape heater chamber 710 is surrounded by a heater assembly 730 having channels 740 embedded within the insulation layer. The heater assembly 730 can also cover the top side of the heater chamber 710. In some embodiments, the heater assembly can also cover the bottom side of the heater chamber (not shown). The channels can be straight channels, or can be curved channels.

In FIG. 7C, horizontal channels 742 can be included to provide flow to the top insulation portion of the heater assembly. The horizontal channels can be interdigitated with the vertical channels 741. In FIG. 7D, the channels 744 can follow the contour of the heater assembly, for example, running vertically at the vertical portion of the heater assembly and then horizontally at the horizontal portion of the heater assembly. Other configurations can also be used.

In some embodiments, the present invention discloses heater assemblies, furnaces utilizing the heater assembly, and methods for operating the heater assemblies and furnaces for improving temperature controls. Channels can be incorporated with the insulation layer to change boundary conditions of the insulation layer, affecting the heating or cooling rates of the furnaces. Stagnant air, natural convection flow or forced flow can be used within these channels.

In some embodiments, a plenum can be positioned at one end of the channels for providing flows to the multiple channels. A plenum airflow through the insulation can be controllable by the use of various speeds for the blower generating the airflow. A controller can be included to control the flow, for example, through the software operating the system, or by a mechanical switch directly operating the blower. In some embodiments, the desirable airflow rate can be dependent on the temperature inside the heater, which can further optimize the cool down rate. For example, the airflow can be lower at higher temperatures and then increases as the heater cools down to lower temperatures.

A channel restrictor can be used to control the conductivity of the channels. For example, a top ring can be included to control the amount of airflow through the heater. The ring can be adjusted manually or pneumatically by activation of actuators controlled by system controller. When the channels are completely shut off, air is stagnant and acts as an insulation, allowing the heater to conserve energy, For example, during temperature ramp up or during process step, e.g., temperature keeping constant, no air flow condition can be used, e.g., the channel restrictor is shut off or the forced air flow is turned off.

In some embodiments, at the top of a heater assembly, there is a flat ring with the same hole pattern and size as the channels of the heater assembly. The ring can move in place to alter the exposed size of the holes. For example, when the holes between the ring and top of the heater are completely aligned, the holes are 100% open. The top plate can completely block the airflow by rotating in place. A screw can be used to secure the location of the plate such that it cannot move once the screw is tightened. In some embodiments, a controller can be included to regulate, e.g., by moving the top plate, the flow through the channels.

Figure 8:
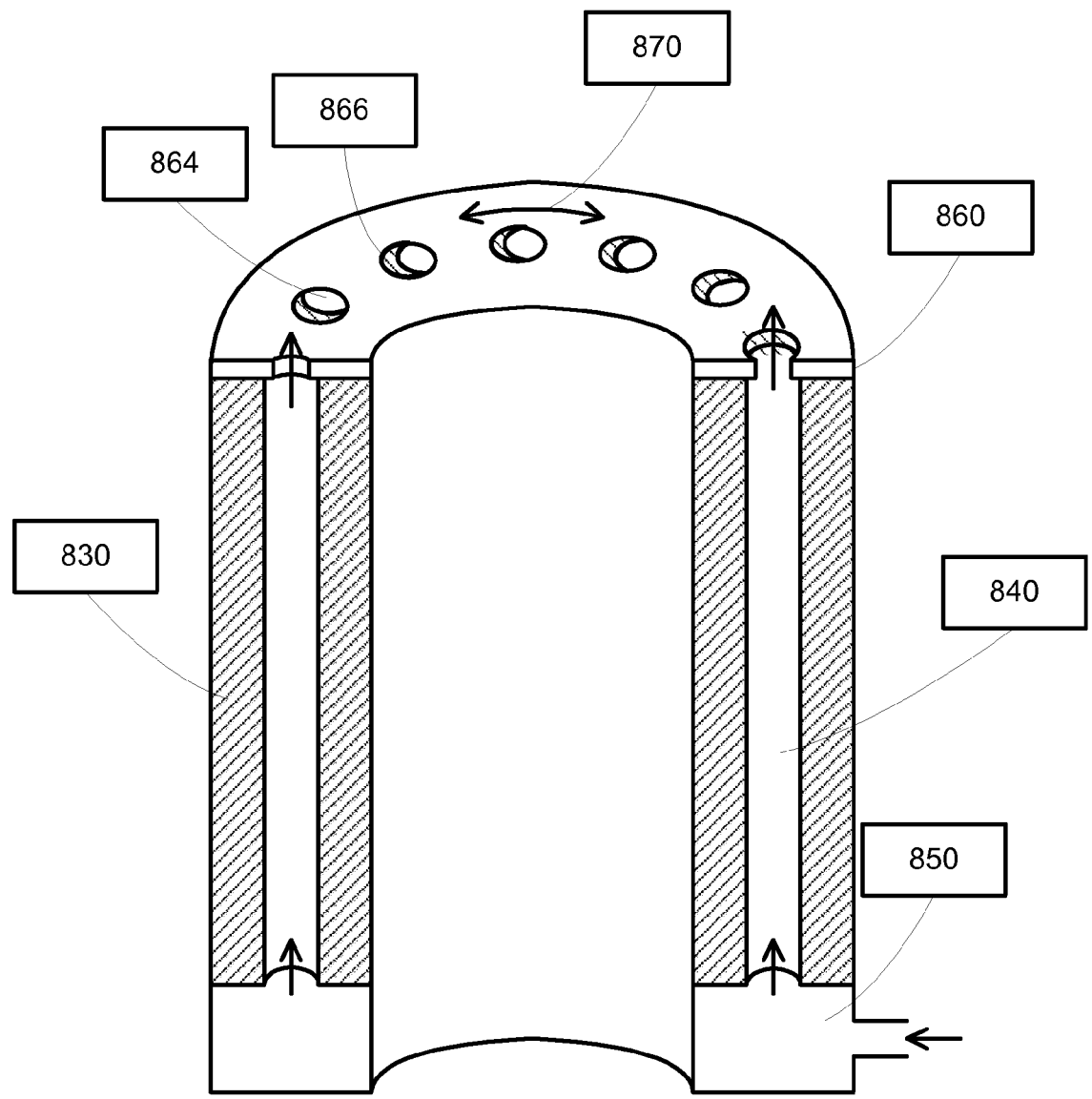
FIG. 8 illustrates a configuration of a heater assembly according to some embodiments of the present invention.

FIG. 8 illustrates a configuration of a heater assembly according to some embodiments of the present invention. An insulation layer 830 can have multiple embedded channels 840. A plenum 850 can be placed at one end, e.g., the bottom, of the channels, providing fluid flow, e.g., gas or liquid flow, to the multiple channels. A flow provider, such as a blower for gas flow or a liquid pump for liquid flow, can be coupled to the plenum to provide forced fluid flow. A controller can also be included to control the fluid flow to the plenum, and/or to the channels.

A top plate 860 can be placed at another end, e.g., the top, of the channels to control the fluid flow through the channels. For example, the top plate can include multiple holes, which can be aligned with the channel exit openings. The top plate can block a portion 866 of the channel, and allow another portion 864 of the channels to pass through. The top plate can move, for example, by rotating, to change the blocking and allowing portions of the channels. In some embodiments, a controller can be included to regulate the flow through the channels, e.g., by moving the top plate 860.

In some embodiments, natural convection cooling can be used. A heater assembly can be used in furnaces for Low-Temp application, in which the enhanced cooling can be constructed without the plenum used for forced-air cooling. For example, a heater can benefit from natural convection cooling from bottom to the top of the heater. A top ring can control the airflow going through the shell of the heater. Stagnant air, e.g., no air flow through the channel, can be used for improving insulation, for example, during temperature ramp up or during process steps.

Figure 9:
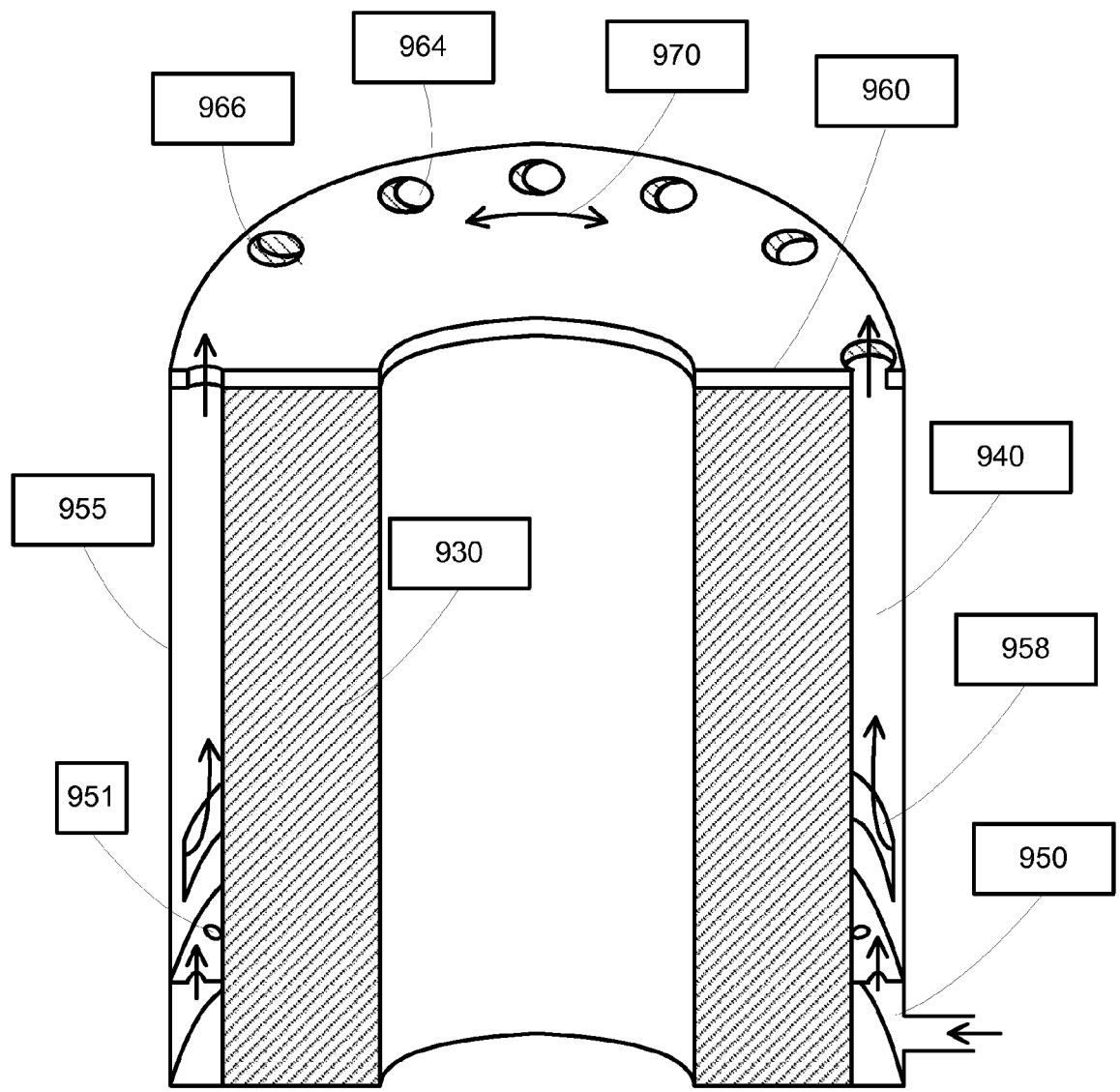
FIG. 9 illustrates another configuration of a heater assembly according to some embodiments of the present invention.

FIG. 9 illustrates another configuration of a heater assembly according to some embodiments of the present invention. An insulation layer 930 can have channels 940 disposed at the outer surface, between the insulation layer 930 and an outer shell 955. Openings 958 can be placed at one end, e.g., the bottom, of the channels, providing fluid flow, e.g., gas or liquid flow, to the channels 940. A controller can also be included to control the fluid flow to the openings 958. In addition, a plenum 950 can be included, for example, having openings 951, to provide forced fluid flow to the channel 940. Other configurations can be used, such as openings 958 without plenum 950, or plenum 950 without the openings 958.

A top plate 960 can be placed at another end, e.g., the top, of the channels to control the fluid flow through the channels. For example, the top plate can include multiple holes, which can be aligned with the channel exit openings. The top plate can block a portion 966 of the channel, and allow another portion 964 of the channels to pass through. The top plate can move, for example, by rotating, to change the blocking and allowing portions of the channels. In some embodiments, a controller can be included to regulate the flow through the channels, e.g., by moving the top plate 960. A high flow can be used to increase the cooling rate of the heater, and zero flow, e.g., completely blocking the openings 958, 951, and/or portions 964, can be used to improve insulation and conserving energy.

Figure 10:
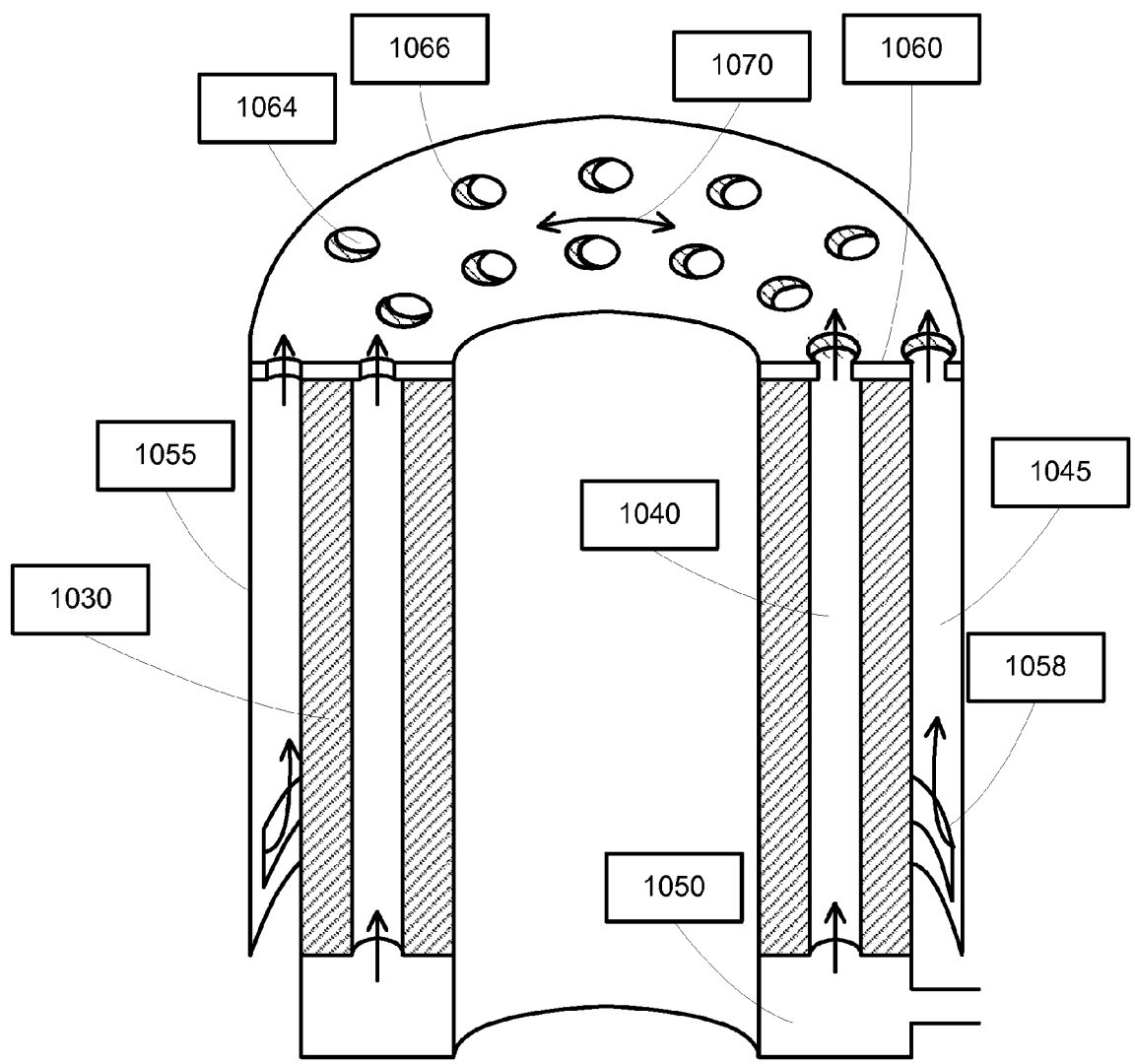
FIG. 10 illustrates another configuration of a heater assembly according to some embodiments of the present invention.

In some embodiments, multiple channels can be used, such as embedded channels and outer channels. FIG. 10 illustrates another configuration of a heater assembly according to some embodiments of the present invention. An insulation layer 1030 can have multiple embedded channels 1040. A plenum 1050 can be placed at one end, e.g., the bottom, of the channels, providing fluid flow, e.g., gas or liquid flow, to the multiple channels. A flow provider, such as a blower for gas flow or a liquid pump for liquid flow, can be coupled to the plenum to provide forced fluid flow. A controller can also be included to control the fluid flow to the plenum, and/or to the channels.

The insulation layer 1030 can also have channels 1045 disposed at the outer surface, between the insulation layer 1030 and an outer shell 1055. Openings 1058 can be placed at one end, e.g., the bottom, of the channels, providing fluid flow, e.g., gas or liquid flow, to the channels 1045. A controller can also be included to control the fluid flow to the openings 1058.

A top plate 1060 can be placed at another end, e.g., the top, of the channels to control the fluid flow through the channels. For example, the top plate can include multiple holes, which can be aligned with the channel exit openings. The top plate can block a portion 1066 of the channel, and allow another portion 1064 of the channels to pass through. The top plate can move, for example, by rotating, to change the blocking and allowing portions of the channels. In some embodiments, a controller can be included to regulate the flow through the channels, e.g., by moving the top plate 1060.

Figures 11A, 11B:
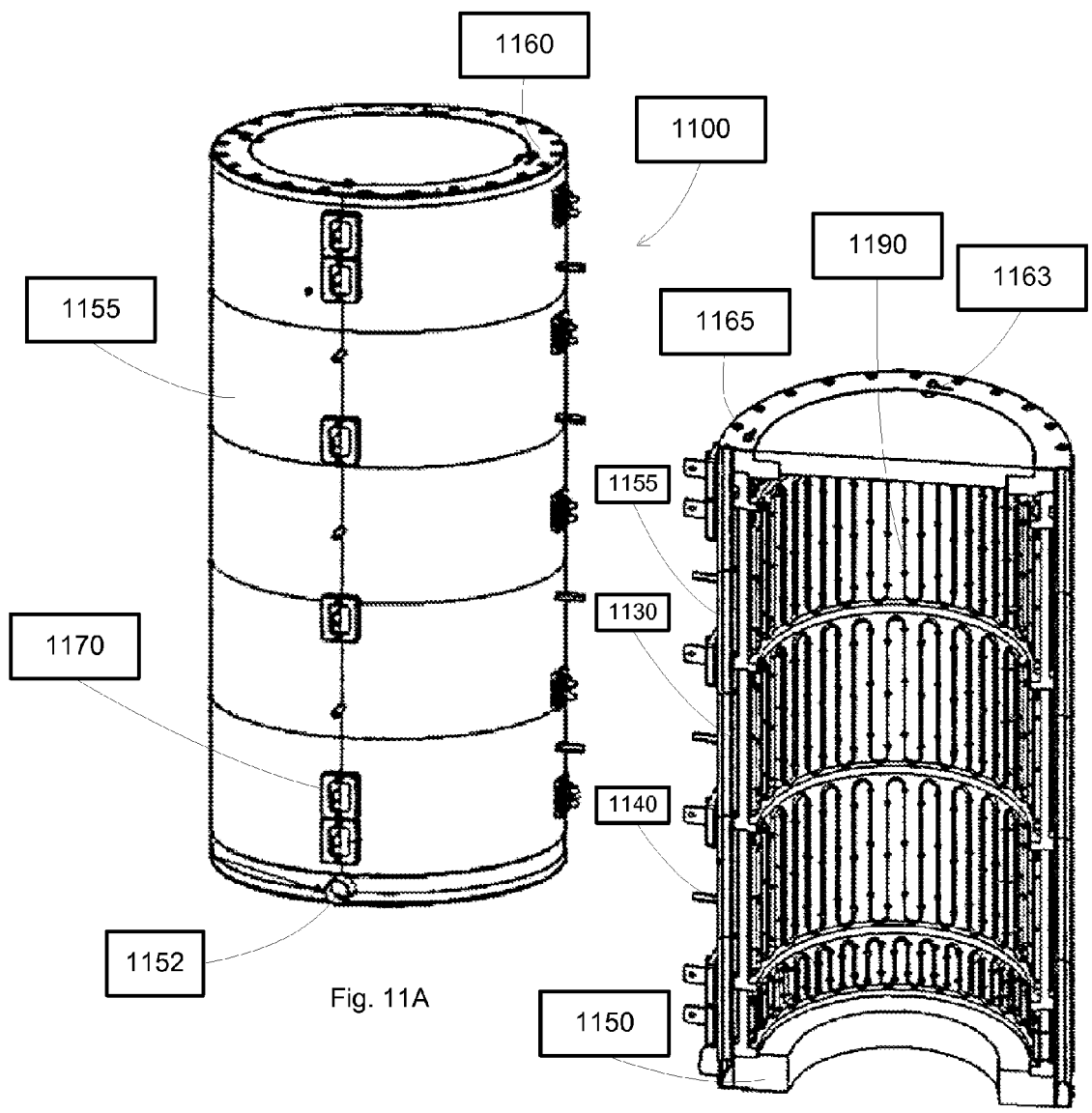
FIGS. 11A-11B illustrate a perspective view and a cross-sectional view of a heater assembly according to some embodiments of the present invention.

FIGS. 11A-11B illustrate a perspective view and a cross-sectional view of a heater assembly according to some embodiments of the present invention. The heater assembly 1100 can include an outer shell 1155, serving as a protective cover. The heater assembly 1100 can include a plenum inlet connection 1152, providing fluid flow, e.g., air flow, to the plenum 1150 to be distributed to the multiple channels 1140. The heater assembly 1100 can include electrical contact leads 1170, which can power electrical heater elements 1190. The channels 1040 can be used for enhanced cooling of the insulation layer 1130. A top ring 1160 can be used to control the openings 1165 of the channels, effectively regulate the flow passing through the insulation layer. A locking mechanism 1163 can be used to lock the top ring movement, fixing the size of the openings.

In some embodiments, the heater assembly can be used in Mid-Temperature (Mid-Temp) applications, e.g., furnaces having operating temperatures between 200 and 1300 C. Other temperature ranges can be used, such as from 25 C to 2000 C.

Figure 12A:
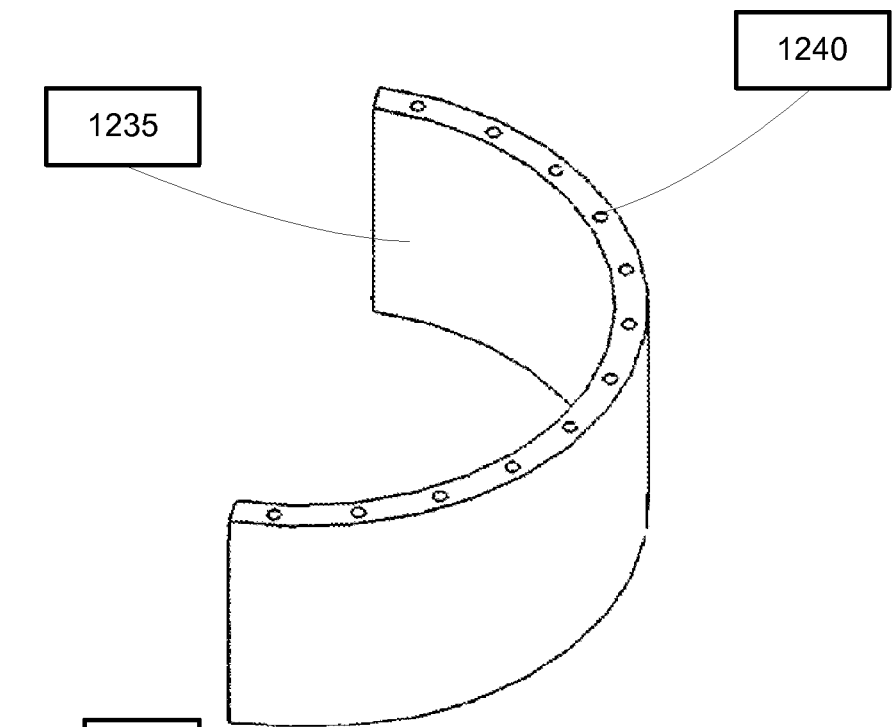
FIG. 12A illustrates a perspective view of a section of an insulation layer according to some embodiments of the present invention.

FIG. 12A illustrates a perspective view of a section of an insulation layer according to some embodiments of the present invention. The insulation can have a half-circular shape, fabricated by vacuum-forming technique. The channels 1140 can be machined along the insulation layer.

Figure 12B:
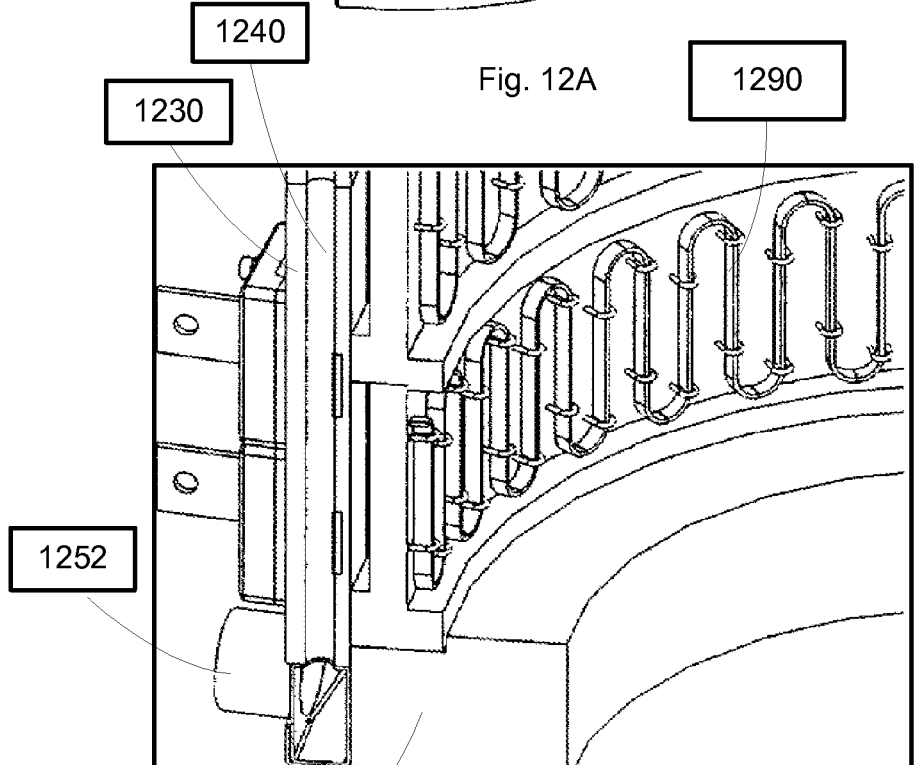
FIG. 12B is a cross-sectional view of the bottom of a heater assembly according to some embodiments of the present invention.

FIG. 12B is a cross-sectional view of the bottom of a heater assembly according to some embodiments of the present invention. The heater assembly can include heater elements 1290, which are insulated by the insulation layer 1230. The heater assembly can include a plenum inlet connection 1252, providing fluid flow, e.g., air flow, to the plenum 1250 to be distributed to the multiple channels 1240. The channels 1240 can be used for enhanced cooling of the insulation layer 1230.

Figure 13A:
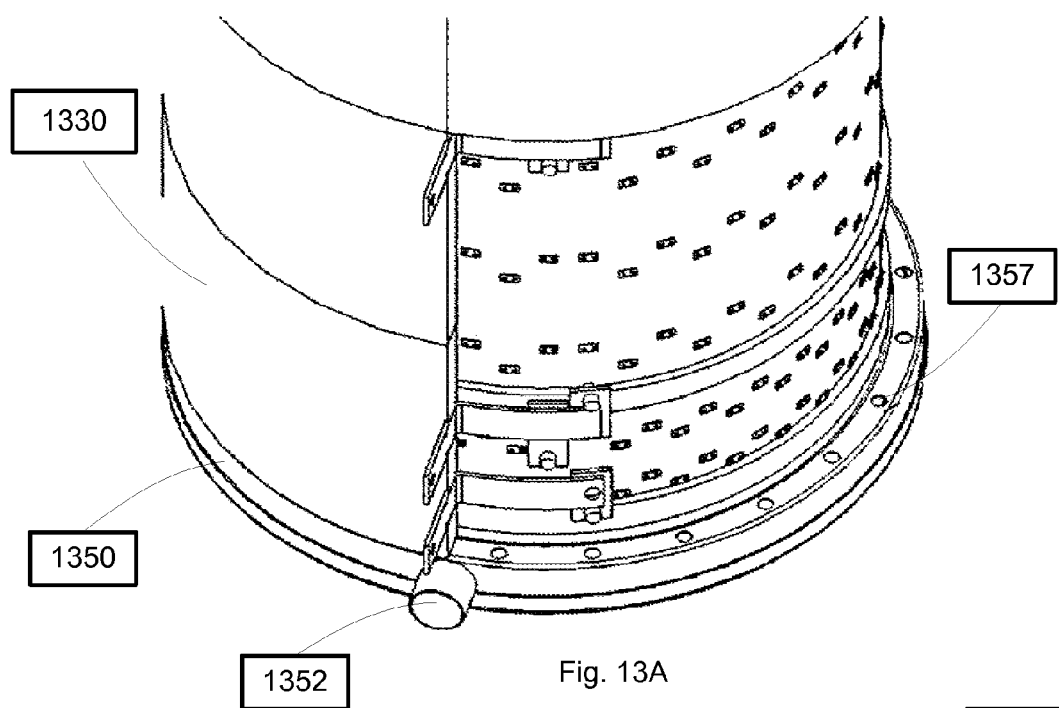
FIGS. 13A-13B illustrate a plenum for directing airflow into channels of a heater assembly according to some embodiments of the present invention.
Figure 13B:
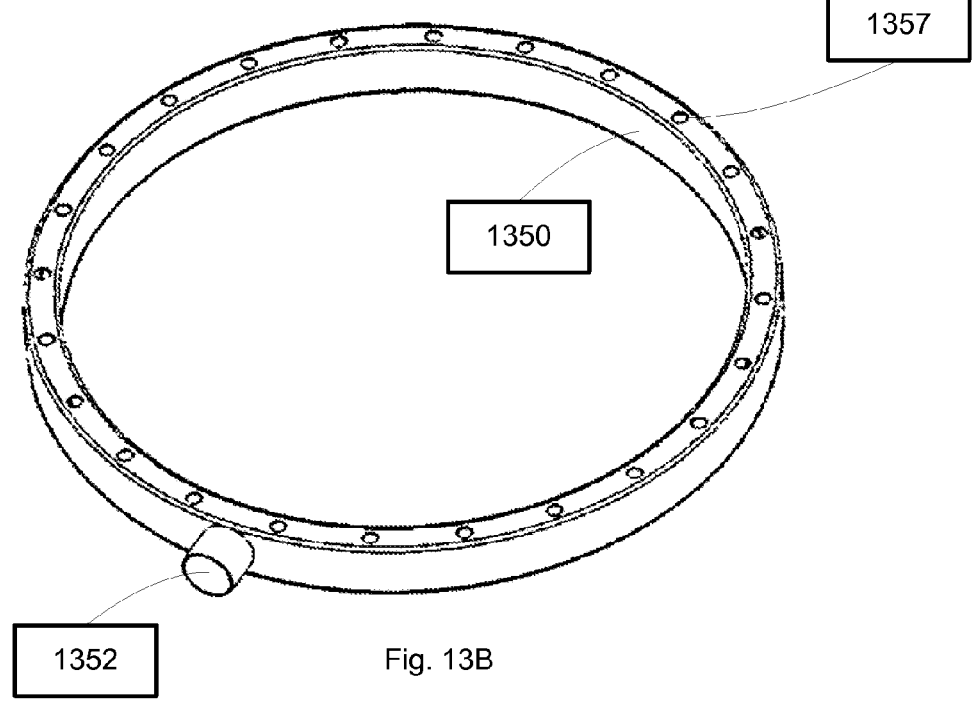

FIGS. 13A-13B illustrate a plenum for directing airflow into channels of a heater assembly according to some embodiments of the present invention. FIG. 13A shows a cut-away perspective view of a heater assembly showing a plenum 1350 at the bottom of the heater assembly for directing airflow into channels incorporated into the heater insulation layer 1330. FIG. 13B shows a perspective view of a plenum 1350, which can include a plenum inlet 1352 and multiple outlets 1357 for directing fluid flow through or across an insulation layer. In some embodiments, the outlets 1357 can be uniformly distributed along the length, e.g., the circumference if the plenum has a circular shape, of the plenum. In some embodiments, the outlets 1357 can be configured to provide uniform flow to the channels. For example, the diameters of the outlets 1357 can be gradually larger along the plenum 1350, e.g., the farther the outlets from the plenum inlet 1352, the larger the diameter of the outlets 1357. The sizes of the outlets can be determined based on the flow through the outlets. Other configurations can also be used, for example, the diameters of the outlets 1357 can be the same or similar along the plenum 1350, or the distances between the outlets 1357 can be longer if closer to the plenum inlet 1352.

Figure 14:
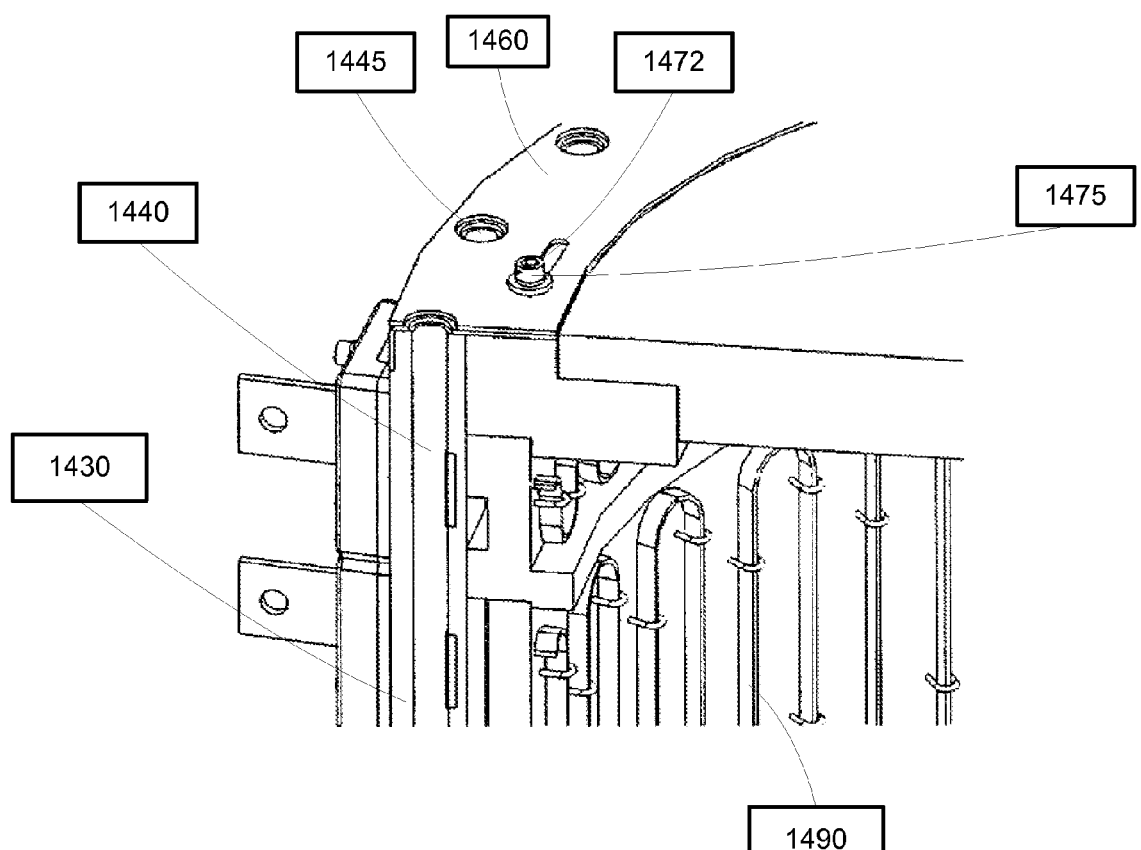
FIG. 14 illustrates a cross-sectional view of the upper section of a heater assembly according to some embodiments of the present invention.

FIG. 14 illustrates a cross-sectional view of the upper section of a heater assembly according to some embodiments of the present invention. An insulation layer 1430 surrounds heater elements 1490 to prevent heat lost from the heater elements. Channels 1440 can be placed within the insulation layer 1430, for example, to enhance cooling rates of the heater assembly. A top plate 1460 can be placed to regulate the channels 1440, for example, by changing the flow conductance of the channels. The top plate 1460 can be rotated, for example, along a slot 1472 to change the outlet openings 1445 of the channels. Fasteners, such as screws 1472, can allow the user to control the hole size and to fix the desired hole size in place.

Figures 15A, 15B:
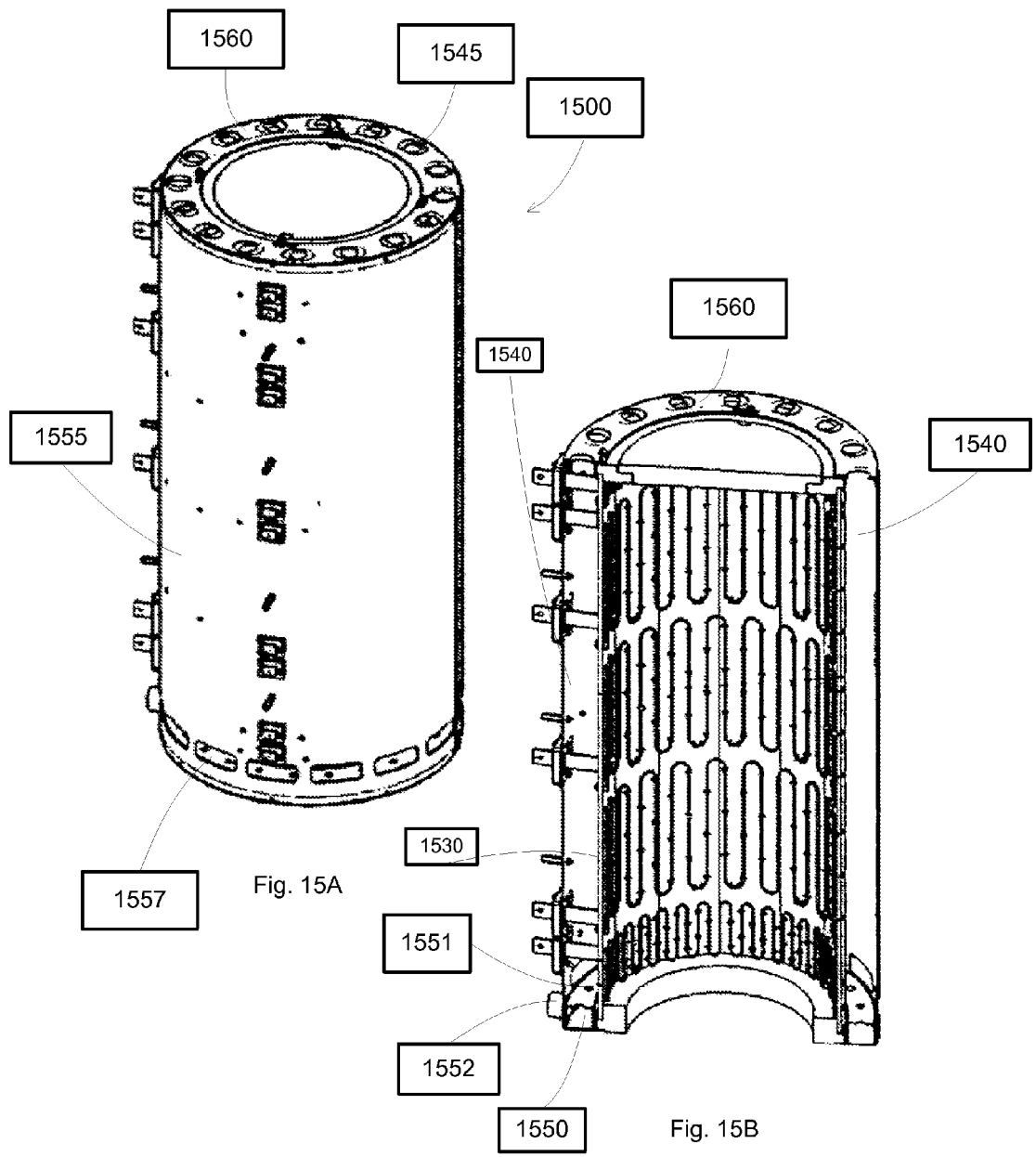
FIGS. 15A-15B illustrate a heater assembly having outer channels according to some embodiments of the present invention.

FIGS. 15A-15B illustrate a heater assembly having outer channels according to some embodiments of the present invention. The heater assembly can be used for low temperature applications, e.g., in furnaces having operating temperatures less than 500 C. FIG. 15A shows a perspective view and FIG. 15B shows a cross sectional view of a heater assembly 1500 having an external shell 1555, which can be stainless steel or aluminum. Multiple bottom openings 1557 on the external shell 1555 can provide natural convection flow to channels 1540, for example, to aid in cooling the insulation layer 1530. A bottom plenum 1550 having a plenum inlet 1552 can provide forced flow to channels 1540 through multiple bottom openings 1551. Multiple top openings 1545 can be used to restrict or regulate the exit flow from the channels 1540. For example, a top plate 1560 can rotate around a central axis, enlarging or reducing the openings 1545.

Figure 16:
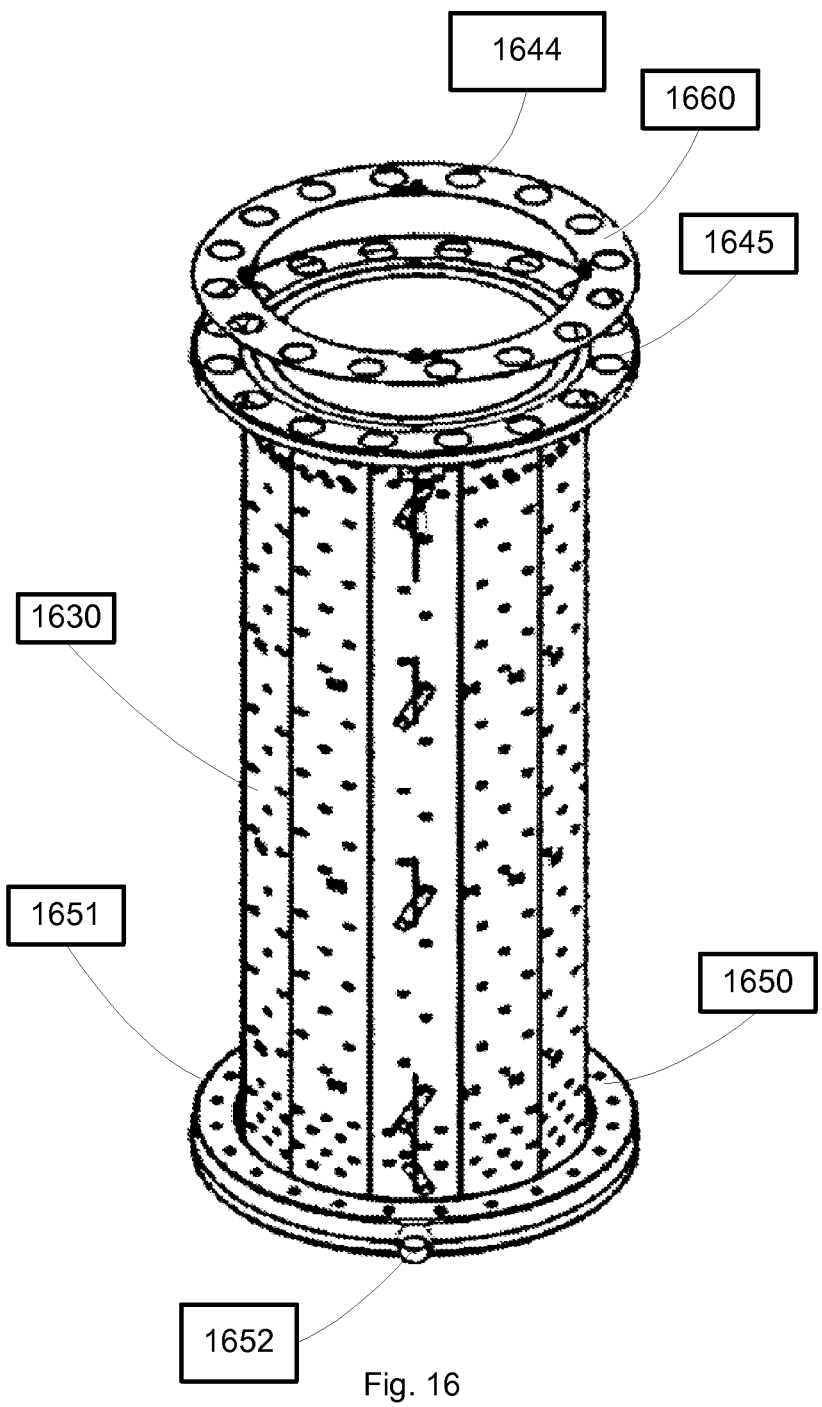
FIG. 16 is an exploded view of a heater assembly according to some embodiments of the present invention.

FIG. 16 is an exploded view of a heater assembly according to some embodiments of the present invention. A perspective view of the heater assembly is shown with the external shell removed, showing the insulation layer 1630. A bottom plenum 1650 having a plenum inlet 1652 can provide flow to multiple bottom openings 1651. Multiple openings 1645 can be used to restrict the flow along the insulation layer 1630, for example, to control the cooling rates of the heater assembly. A top ring 1660 having multiple openings 1644 can be used to regulate the exit flow from multiple openings 1645.

In some embodiments, the openings 1644 of the top ring can be uniformly distributed along the length, e.g., the circumference if the top ring has a circular shape, of the top ring. In some embodiments, the openings 1644 can be configured to provide uniform flow to the channels. For example, the diameters of the openings 1644 can be gradually larger along the top ring 1660, e.g., the farther the openings from the channels nearest the plenum inlet 1352, the larger the diameter of the openings 1644. Other configurations can also be used, for example, the diameters of the openings 1644 can be the same or similar along the top ring 1660, or the distances between the openings 1644 can be longer if closer to the channels nearest the plenum inlet 1352.

FIGS. 17A-17B illustrate a bottom section of a heater assembly according to some embodiments of the present invention. The heater assembly can be used for low temperature applications, e.g., in furnaces having operating temperatures less than 500 C. FIG. 17A shows an expanded view and FIG. 17B shows a cross sectional view of a bottom section of a heater assembly having cut-outs 1757 in the external shell 1755 serving as fluid inlets for natural convection cooling through channels 1740. The plenum inlet 1752 and the plenum 1750 can provide airflow to generate forced convection cooling, for example, through the openings 1751 when higher cool down rates are desired.

Figure 18A:
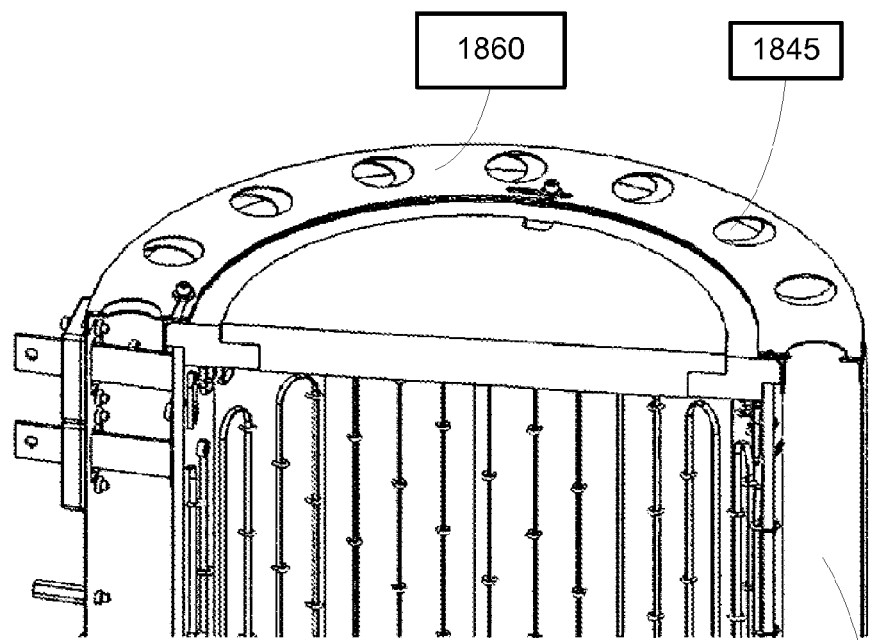
FIG. 18A illustrates a cross-sectional view of the upper section of a heater assembly according to some embodiments of the present invention.

FIG. 18A illustrates a cross-sectional view of the upper section of a heater assembly according to some embodiments of the present invention. The heater assembly can be used for low temperature applications, e.g., in furnaces having operating temperatures less than 500 C. A top ring 1860 having multiple openings can rotate around a central axis, enlarging or reducing the exit flow of the channels 1840. The channels 1840 can be disposed between the insulation and the outer shell for airflow. Fasteners, such as screws 1875, allow the user to control the hole size and to fix the desired hole size in place.

Figure 18B:
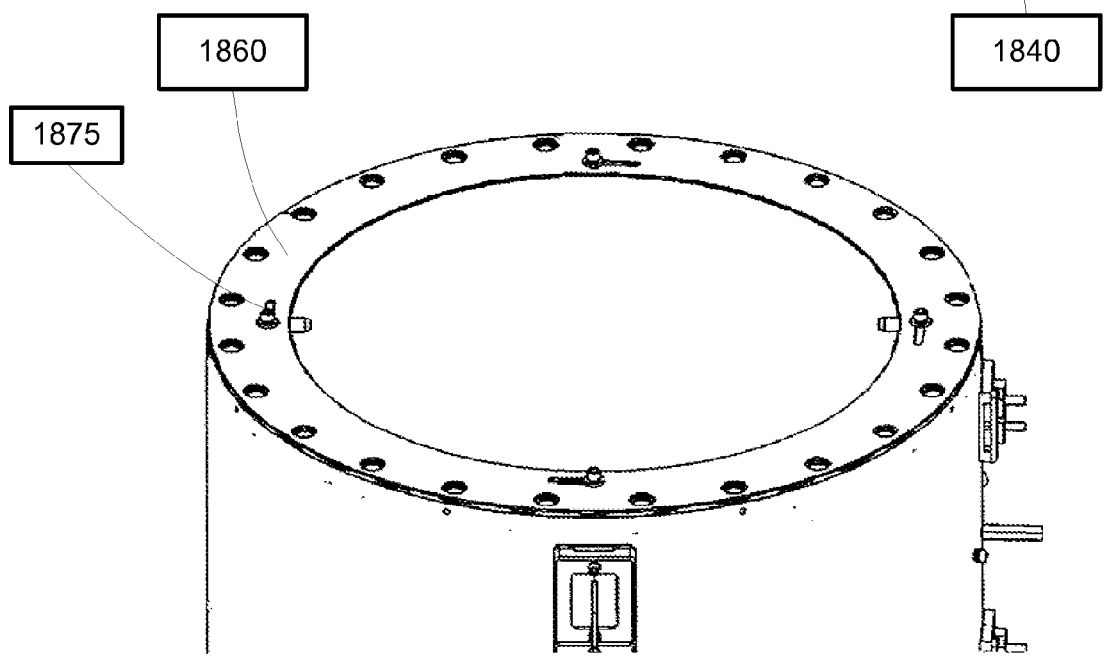
FIG. 18B illustrates a top ring in a heater assembly according to some embodiments of the present invention.

FIG. 18B illustrates a top ring in a heater assembly according to some embodiments of the present invention. The hole opening 1845 can be adjusted for optimum airflow. Once the airflow is adjusted, the screw 1875 can keep the top ring 1860 in position.

Figure 19A:
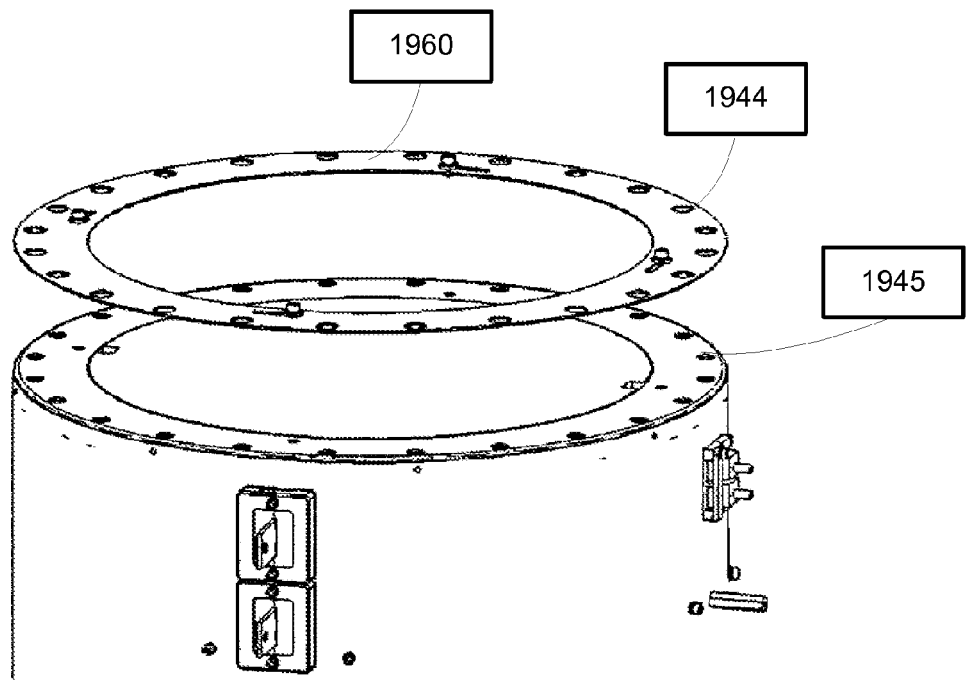
FIGS. 19A-19B illustrate a top ring of a heater assembly according to some embodiments of the present invention.
Figure 19B:
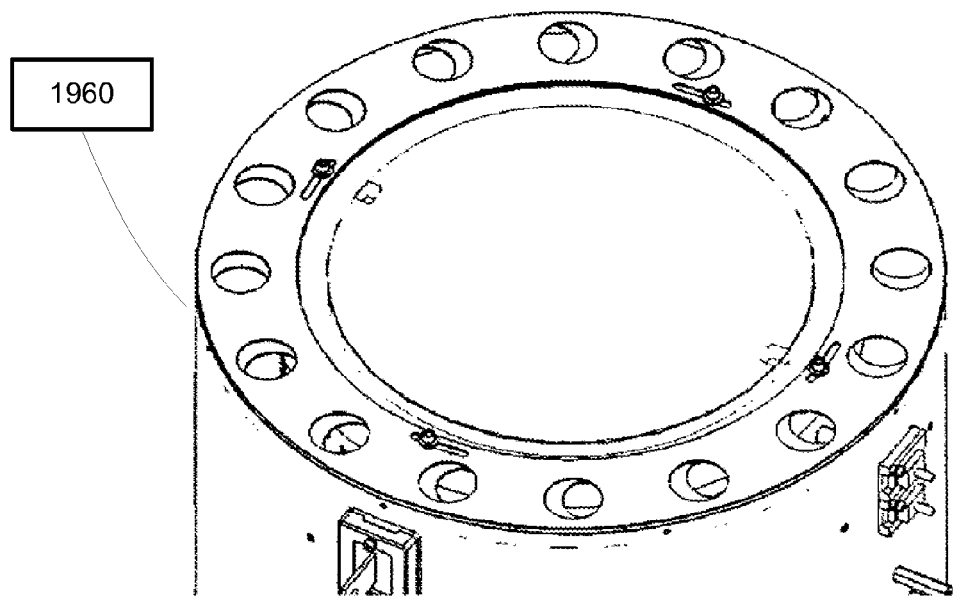

FIGS. 19A-19B illustrate a top ring of a heater assembly according to some embodiments of the present invention. The heater assembly can be used for low temperature applications, e.g., in furnaces having operating temperatures less than 500 C. FIG. 19A shows an exploded view and FIG. 19B shows a perspective view of a top ring 1960 for a heater assembly, showing multiple openings 1944, which can be used to regulate the flow from multiple openings 1945 from the channels in the heater assembly.

In some embodiments, the openings 1945 coupled to outer channels, e.g., channels positioned between the outer surface of an insulation layer and an external shell, can be larger than the openings coupled to embedded channels, e.g., channels positioned within the insulation layer. The larger openings can accommodate higher flow, for example, for either low temperature applications or for natural convection flow.

Figure 20A:
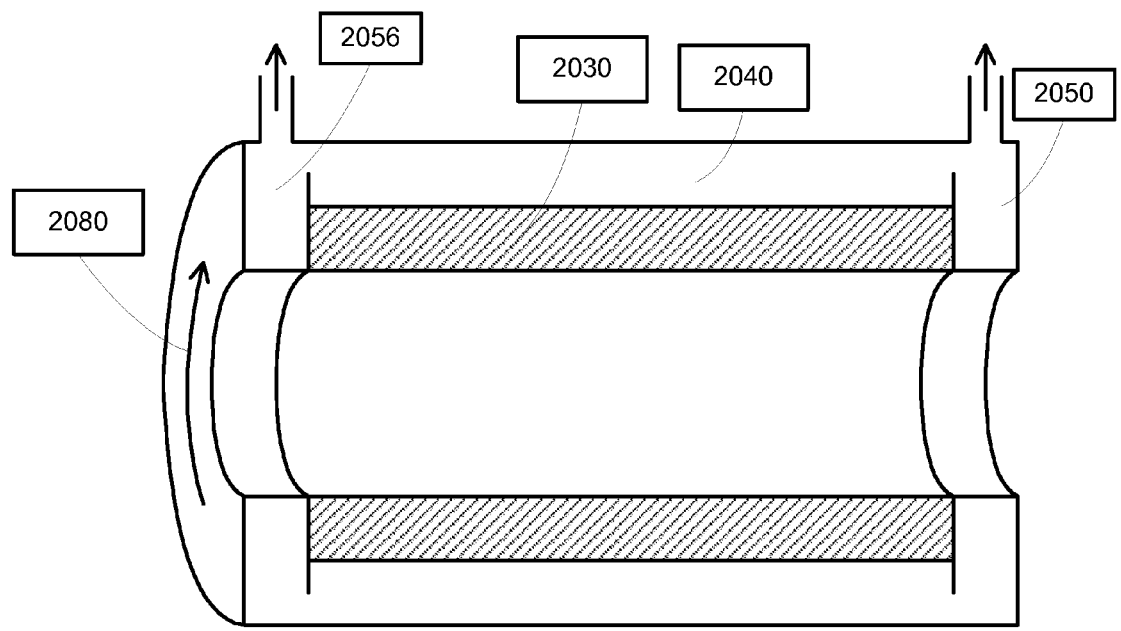
FIGS. 20A-20B illustrate perspective views of a heater assembly in a horizontal configuration according to some embodiments of the present invention.
Figure 20B:
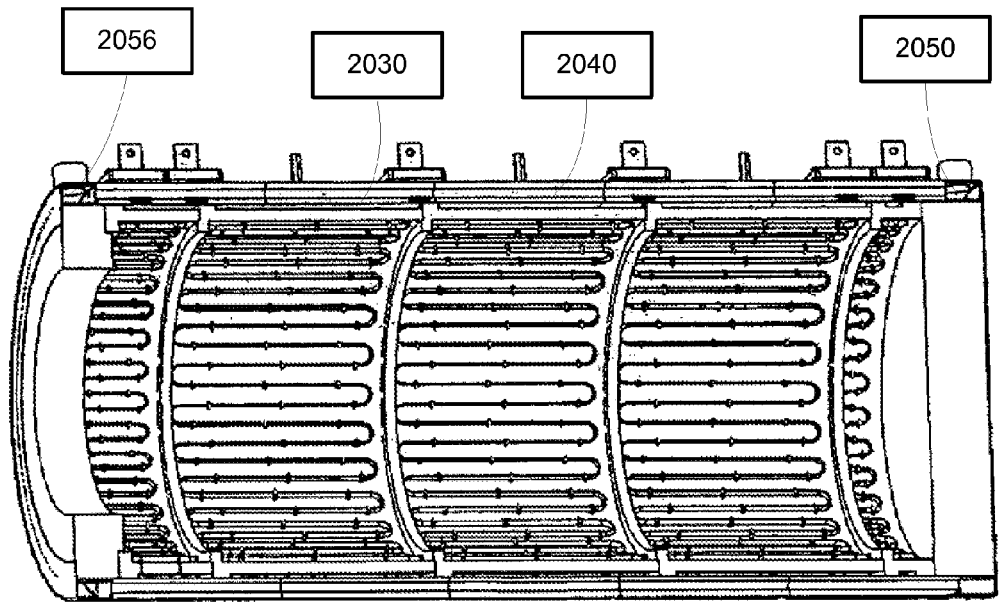

FIGS. 20A-20B illustrate perspective views of a heater assembly in a horizontal configuration according to some embodiments of the present invention. Multiple flanges or plenums 2050 and 2056 can be included to configure the fluid flows, for example, in the direction of rising heat or in the direction opposite to rising heat. A first flange or plenum 2056 can be used on one side of the heater assembly, and a second flange or plenum 2050 can be used on another side of the heater assembly to provide flows in channels 2040 in direction 2080 of rising heat, e.g., upward. Other configurations can also be used, such as additional plenum inlets at bottom sides for forced fluid flow, additional plenum outlets along the channels 1040, and additional channels embedded within the insulation layer 2030.

In some embodiments, the present invention discloses methods to operate a heater assembly and a furnace utilizing a heater assembly, wherein the heater assembly can include one or more channels for improving controls of the heating and/or cooling rates. For example, a natural convection can control a boundary condition of an insulation layer of the heater assembly, which can increase the cooling rate of the heater assembly and the furnace utilizing the heater assembly. In some embodiments, the natural convection flow can be controlled or regulated, for example, by varying a flow conductance of the fluid flow, to achieve a desired cooling rate. The fluid flow can also be controlled depending on the temperature of the heater to optimize the cooling rate, such as a higher flow for lower temperatures and a lower flow for higher temperatures.

In some embodiments, a forced fluid flow can be used to increase the cooling rate of the heater assembly (or the furnace utilizing the heater assembly). The cooling rate can further be controlled by varying the fluid flow, either by changing the flow conductance or by changing the change in flow pressure.

FIGS. 21A-21B illustrate flowcharts for controlling a heater assembly, and a furnace utilizing a heater assembly, according to some embodiments of the present invention. In FIG. 21A, a method for controlling a temperature rate of a furnace, such as controlling a cooling rate, can be provided by flowing or regulating a fluidic flow through multiple channels of an insulation layer. The fluidic flow can include a gaseous flow, such as an air flow, or a liquid flow, such as a water flow. The fluidic flow can include a natural convection gas flow, a gravity-assist liquid flow, or a forced flow, gaseous or liquid flow, provided by external mechanism, such as a pump or a blower. The fluidic flow can be provided at a distance from the heater elements. The distance can be less than the thickness of the insulation layer, e.g., the fluidic flow is provided in multiple channels embedded within the insulation layer, or can be at an outer surface of the insulation layer. The distance can be equal to about the thickness of the insulation layer, e.g., the fluidic flow is provided in multiple channels at an outer surface of the insulation layer.

In operation 2100, a heated chamber is provided, wherein at least a portion of the heated chamber is covered with an insulation layer to insulate the chamber. The heated chamber can be completely covered by the insulation layer, or can be surrounded by the insulation layer, leaving the top and/or the bottom not being covered by the insulation layer. The heated chamber can be heated by a heater element, which is covered by the insulation layer to minimize the heat loss. In some embodiments, after the heater element is operated for a desired time and temperature, the heater element is turned off.

In operation 2110, a fluidic flow is provided, e.g., flowed, through one or more channels of the insulation layer. There can be multiple channels running along the insulation layer. There can be one large channel surrounding the insulation layer. The fluidic flow can be flowed in channels embedded within the insulation layer, or can be flowed in channels between the insulation layer and an outer shell. The heater can be turned off before flowing the fluidic flow, wherein the heater provides heat to the heated chamber, and the fluidic flow provides cooling to the insulation layer, which in turn increases the cooling rate of the heated chamber.

In some embodiments, the fluidic flow can include a gaseous flow, such as an air flow. A gaseous flow can be established by a blower or a fan. The fluidic flow can include a liquid flow, such as a liquid flow or a coolant flow. A liquid flow can be established by a liquid pump. A coolant flow can be established by a cooler unit, together with a heat exchanger to circulate the fluidic flow. The temperature of the heated chamber can be less than about 2000 C, can be less than about 1300 C, can be less than about 1100 C, or can be less than about 500 C.

In some embodiments, the fluidic flow can be controlled or regulated, for example, to achieve a desired cooling rate or to achieve a substantially uniform temperature profile in the heated chamber. For example, in general, high fluid flow can increase the cooling rate, which can be controlled or regulated by changing a flow conductance, by changing a flow rate, or by changing a pressure difference between an inlet and an outlet of the channels. The fluidic flow can be controlled or regulated as a function of the temperature in the heated chamber, for example, to optimize the cooling rate. For example, lower chamber temperature can require higher fluid flow to achieve a similar cooling rate as compared to higher chamber temperatures.

In some embodiments, the fluidic flow can be manually adjusted, for example, by adjusting a flow conductance of the multiple channels. The flow conductance can be adjusted by varying an outlet size, such as by rotating a ring to varying the inlet or outlet openings that the fluidic flow can enter or exit from the channels. After adjusting the fluidic flow to achieve a desired effect, such as a desired cooling rate, the fluidic flow can be fixed against further changes or further fluctuation.

In some embodiments, the fluidic flow can be automatically adjusted, for example, through a controller. For example, the cooling rate can be monitored, and the flow conductance can be regulated, e.g., increasing or decreasing, to achieve a desired cooling rate. Further, other conditions can be regulated, such as flow velocity or pressure difference between the inlet and outlet of the channels. For example, a blower speed can be adjusted to change a gas flow to the channels. A pump speed can be adjusted to change a liquid flow to the channels. A cooler unit or a heat exchanger can be adjusted to change a temperature of the fluid within the channels.

In some embodiments, the present invention discloses a method for rapid cooling a chamber, the method comprising providing a heated chamber, wherein at least a portion of the heated chamber is covered with an insulation layer to insulate the chamber; flowing a fluidic flow through one or more channels within the insulation layer. The method can further comprise turning off a heater before flowing the fluidic flow, wherein the heater provides heat to the heated chamber, and can further comprise flowing the fluidic flow through a heat exchanger before of after the fluidic flow entering or exiting the plurality of channels. In some embodiments, the fluidic flow can comprise a gas flow. The fluidic flow can comprise a liquid flow. The temperature of the heated chamber can be less than 2000 C or can be less than 1300 C. The fluidic flow can be regulated to achieve a substantially uniform temperature in the heated chamber. The fluidic flow can be manually adjusted. The fluidic flow can be automatically adjusted through a controller. The fluidic flow can be adjusted by varying outlet openings of the plurality of channels. The fluidic flow can be adjusted by varying a blower providing a gas flow to the plurality of channels.

In FIG. 21B, a method for controlling a temperature rate of a furnace, such as controlling a cooling rate, can be provided by adjusting or regulating a fluidic flow through multiple channels of an insulation layer. The fluidic flow can include a gaseous flow, such as an air flow, or a liquid flow, such as a water flow. The fluidic flow can include a natural convection gas flow, or a gravity-assist liquid flow. The fluidic flow can be provided at a distance from the heater elements. The distance can be less than the thickness of the insulation layer, e.g., the fluidic flow is provided in multiple channels embedded within the insulation layer, or can be at an outer surface of the insulation layer. The distance can be equal to about the thickness of the insulation layer, e.g., the fluidic flow is provided in multiple channels at an outer surface of the insulation layer.

In operation 2150, a heated chamber is provided, wherein at least a portion of the heated chamber is covered with an insulation layer to insulate the chamber. The heated chamber can be completed covered by the insulation layer, or can be surrounded by the insulation layer, leaving the top and/or the bottom not being covered by the insulation layer. The heated chamber can be heated by a heater element, which is covered by the insulation layer to minimize the heat loss. In some embodiments, after the heater element is operated for a desired time and temperature, the heater element is turned off.

In operation 2160, a fluidic flow is adjusted, controlled or regulated through one or more channels of the insulation layer. There can be multiple channels running along the insulation layer. There can be one large channel surrounding the insulation layer. The fluidic flow can be flowed in channels embedded within the insulation layer, or can be flowed in channels between the insulation layer and an outer shell. The heater can be turned off before flowing the fluidic flow, wherein the heater provides heat to the heated chamber, and the fluidic flow provides cooling to the insulation layer, which in turn increases the cooling rate of the heated chamber.

In some embodiments, the fluidic flow can include a gaseous flow, such as an air flow. The fluidic flow can be a liquid flow, such as a water flow, running under the force of gravity. The adjustment can include a control of the flow conductance, such as changing the size of the exit openings of the channels. For example, a ring can be used to regulate the exit of the channels, wherein a rotation of the ring could enlarge or reduce multiple exit openings at a same time. The flow adjustment can include a change of the size of the entrance openings of the channels. For example, multiple cut outs can be placed and controlled at the based of the channels, which can affect the flow rate of air entering the channels. After adjusting the fluidic flow to achieve a desired effect, such as a desired cooling rate, the fluidic flow can be fixed against further changes or further fluctuation.

In some embodiments, the fluidic flow can be manually adjusted, for example, by an operator rotating a ring at the top of the heater assembly (for regulating the exit openings), or by changing the size of the cut outs at the bottom of the heater assembly (to regulate the entrance openings). In some embodiments, the fluidic flow can be automatically adjusted, for example, through a controller. For example, the cooling rate can be monitored, and the entrance and/or exit openings can be regulated, e.g., increasing or decreasing, to achieve a desired cooling rate.

In some embodiments, the channels are running along a direction of rising heat, e.g., against gravitation force, such as non-horizontal, making an angle with the horizontal plane, or substantially vertical. The temperature of the heated chamber can be less than about 2000 C, can be less than about 1300 C, can be less than about 1100 C, or can be less than about 600 C.

In some embodiments, the fluidic flow can be controlled or regulated, for example, to achieve a desired cooling rate or to achieve a substantially uniform temperature profile in the heated chamber. The fluidic flow can be controlled or regulated as a function of the temperature in the heated chamber, for example, to optimize the cooling rate. For example, lower chamber temperature can require higher fluid flow, e.g., larger entrance or exit openings, to achieve a similar cooling rate as compared to higher chamber temperatures.

In some embodiments, the present invention discloses a method for rapid cooling a chamber, the method comprising providing a heated chamber, wherein at least a portion of the heated chamber is covered with an insulation layer to insulate the chamber; adjusting a fluidic flow through one or more channels within the insulation layer. The method can further comprise turning off a heater before adjusting the fluidic flow, wherein the heater provides heat to the heated chamber. In some embodiments, the temperature of the heated chamber can be less than 600 C. The fluidic flow can be regulated to achieve a substantially uniform temperature in the heated chamber. The fluidic flow can be manually adjusted. The fluidic flow can be automatically adjusted through a controller. The fluidic flow can be adjusted by varying outlet openings of the plurality of channels. The fluidic flow can be adjusted by varying inlet openings of the plurality of channels.

In some embodiments, the present invention discloses methods to operate a heater assembly and a furnace utilizing a heater assembly, wherein the heater assembly can include one or more channels for reducing cycle time and/or reducing energy consumption. For example, no flow condition can be used in ramping up or in steady state operations of the heater. In the no flow condition, the channels can have stagnant air, which can provide high insulation, e.g., better than the convection outside air ambient, leading to energy saving. In the flow condition, the channels can have fluidic flow, which can provide faster cooling rate due to the boundary conditions, leading to faster cycle time and higher throughput.

In some embodiments, the present invention discloses methods to operate a heater assembly and a furnace utilizing a heater assembly, wherein the heater assembly can include one or more channels for improving controls of the temperature regulation. For example, a fluidic flow can control a boundary condition of an insulation layer of the heater assembly, which can increase the cooling rate of the heater assembly and the furnace utilizing the heater assembly. Together with the heater elements control the heating rate of the heater assembly, an improvement in temperature control can be achieved.

In general, a heater element can have higher heating rate than cooling rate, since the heating rate can be rapidly increased by increasing the power applied to the heater element, while the cooling rate depends on the heat dissipation to the ambient. Thus by providing an active cooling mechanism, the heater assembly can regulate the temperature effectively, for example, by reducing the temperature oscillation or overshoot.

In some embodiments, the present invention discloses methods for fast heating without or with reduced temperature overshoot or oscillation. A fast heating rate can be performed, following by a fast cooling rate when the temperature is near a target temperature. The fast cooling rate can prevent or reduce temperature overshoot, allowing a faster heating of a furnace. For example, in a typical heating rate without the invention improved cooling rate, when the temperature is near the target temperature, e.g., at about 80% of the target temperature, the heating rate will need to be significantly reduced to prevent temperature overshoot, since the cooling rate is strongly dependent on the ambient and cannot be controlled. In contrast, with the heater assembly having improved cooling rate of the present invention, the heating rate can continue to be high, for example, until approaching 90 or 95% of the target temperature. The cooling flow can be turned on for faster cooling rate, even with the high heating rate, until the temperature is close to the target temperature.

In some embodiments, the present invention discloses methods for precision controls of temperature. When a chamber temperature drops, a heater element can be turned on to increase the temperature. A fast heating rate can be used, followed by a fast cooling rate to bring the temperature back. The fast cooling rate can allow faster temperature recovering, reducing temperature fluctuation and providing better temperature precision. For example, in a typical heating rate without the invention improved cooling rate, when the temperature is dropped from the target temperature, the heating rate will need to be gradually increased to prevent temperature overshoot. This can lead to high temperature fluctuation, or lower control of temperature precision.

In some embodiments, the heater assembly having fluidic channels can provide cooling during the heat up cycle, e.g., by flowing flows to the channels of the heater assembly, the heater can operate and control temperature at high temperature precision than standard heaters. Extending the range of the operating temperature precision of the heater can provide flexibility in the fabrication facility production line. For example, for the processing of wafers in the semiconductor industry, the temperature inside the heater typically needs to be controlled and stabilized to about ±0.25 C. It is difficult to stabilize a standard heater to this precision, especially when the temperature of the heater is to be maintained to this precision in the temperature range of about 600 C. A long time, or a dedicated balance is usually required to achieve this stabilization precision at this temperature range, detrimental to overall processing efficiency.

In contrast, heaters pursuant to some embodiments of the present invention typically flow air through the insulation as the heater ramps up. This air flow tends to increase the heat loss from the walls which results in better temperature control and faster stabilization.

Figure 22:
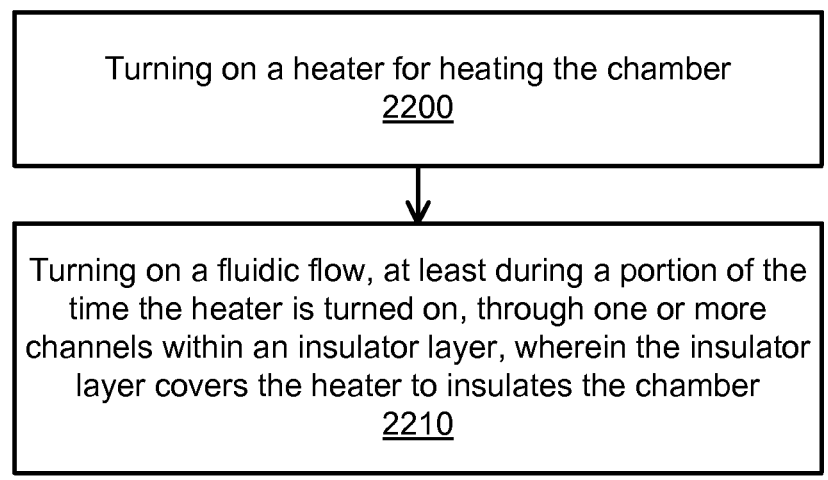
FIG. 22 illustrates a flowchart for controlling a heater assembly, and a furnace utilizing a heater assembly, according to some embodiments of the present invention.

FIG. 22 illustrates a flowchart for controlling a heater assembly, and a furnace utilizing a heater assembly, according to some embodiments of the present invention. In operation 2200, a heater is turned on for heating a process chamber. In operation 2210, a fluidic flow is turned, at least during a portion of the time the heater is turned on, through one or more channels within an insulation layer, wherein the insulation layer covers the heater to insulate the chamber. The fluidic flow can be turned on during the ramping up of the heater, to achieve a fast temperature ramp up. The fluidic flow can be turned on during a temperature stabilization, e.g., after the temperature of the chamber has reached equilibrium at a target temperature, to achieve a fast control of minimizing temperature fluctuation, e.g., achieving a target temperature precision in which the temperature has a minimum variation around the target temperature.

In some embodiments, the fluidic flow can include a gaseous flow, such as an air flow. A gaseous flow can be established by a blower or a fan. The fluidic flow can include a liquid flow, such as a liquid flow or a coolant flow. A liquid flow can be established by a liquid pump. A coolant flow can be established by a cooler unit, together with a heat exchanger to circulate the fluidic flow.

In some embodiments, the fluidic flow can be manually adjusted, for example, by adjusting a flow conductance of the multiple channels. The flow conductance can be adjusted by varying an outlet size, such as by rotating a ring to varying the inlet or outlet openings that the fluidic flow can enter or exit from the channels.

In some embodiments, the fluidic flow can be automatically adjusted, for example, through a controller. For example, the temperature and the cooling rate can be monitored, and the heater elements and the flow conductance can be regulated, e.g., increasing or decreasing, to achieve a desired heating rate or temperature precision. Further, other conditions can be regulated, such as flow velocity or pressure difference between the inlet and outlet of the channels. For example, a blower speed can be adjusted to change a gas flow to the channels. A pump speed can be adjusted to change a liquid flow to the channels. A cooler unit or a heat exchanger can be adjusted to change a temperature of the fluid within the channels.

In some embodiments, the fluidic flow can be turned off, for example, generating stagnant air in the channels, which can act as insulation, allowing the heater to conserve energy, for example, during ramp up time or during steady state time.

What is claimed is:
1. A heater insulation, comprising
 a layer of insulation material, wherein the layer of insulation is configured to insulate a heater element from an outside ambient;
 one or more channels disposed within the layer of insulation, wherein the plurality of channels passes through along a length of the layer of insulation;
 a manifold coupled to the plurality of channels, wherein the manifold comprises an inlet;
 a restrictor assembly coupled to the plurality of channels, wherein the restrictor assembly is configured to adjustably change a flow rate of the plurality of channels; and
 a locking assembly coupled to the restrictor assembly, wherein the locking assembly is configured to fixedly couple the restrictor assembly to the layer of insulation.

2. A heater insulation as in claim 1 wherein the plurality of channels comprises straight lines or curved lines passing along the length of the layer of insulation.

3. A heater insulation as in claim 1 further comprising
a controller assembly coupled to the restrictor assembly, wherein the controller assembly is configured to automatically adjust the flow rate of the plurality of channels.

4. A heater insulation as in claim 1 further comprising
a blower assembly coupled to the inlet of the manifold.

5. A heater insulation as in claim 1 wherein the plurality of channels is vacuum formed within the layer of insulation.

6. A heater insulation as in claim 1 further comprising
one or more tubes disposed in the layer of insulation.

7. A system comprising
a heater;
a layer of insulation material, wherein the layer of insulation is configured to insulate the heater from an outside ambient;
one or more channels disposed within the layer of insulation, wherein the plurality of channels passes through along a length of the layer of insulation;
a manifold coupled to the plurality of channels, wherein the manifold comprises an inlet;
a restrictor assembly coupled to the plurality of channels, wherein the restrictor assembly is configured to adjustably change the flow rate of the plurality of channels; and
a locking assembly coupled to the restrictor assembly, wherein the locking assembly is configured to fixedly couple the restrictor assembly to the layer of insulation.

8. A system as in claim 7 further comprising
a quartz tubes, wherein the heater is disposed outside the quartz tube.

9. A system as in claim 7 further comprising
a controller assembly coupled to the restrictor assembly, wherein the controller assembly is configured to automatically adjust the flow rate of the plurality of channels.

10. A system as in claim 7 further comprising
a blower assembly coupled to the inlet of the manifold.

11. A method for controllably heating a chamber, the method comprising
turning on a heater for heating the chamber;
turning on a fluidic flow, at least during a portion of the time the heater is turned on, through one or more channels within an insulation layer, wherein the insulation layer covers the heater to insulate the chamber; and
wherein the fluidic flow is adjusted by varying outlet openings of the plurality of channels.

12. A method as in claim 11 wherein the fluidic flow comprises a gas flow or a liquid flow.

13. A method as in claim 11 wherein the fluidic flow is manually adjusted.

14. A method as in claim 11 wherein the fluidic flow is automatically adjusted through a controller.

15. A method as in claim 11 further comprising
flowing the fluidic flow through a heat exchanger before or after the fluidic flow entering or exiting the plurality of channels.

* * * * *